(12) United States Patent
Fukuoka et al.

(10) Patent No.: US 6,872,893 B2
(45) Date of Patent: Mar. 29, 2005

(54) WIRING BOARD PROVIDED WITH PASSIVE ELEMENT AND CONE SHAPED BUMPS

(75) Inventors: Yoshitaka Fukuoka, Fuchu (JP); Tooru Serizawa, Tokyo (JP); Hiroshi Yagi, Tokyo (JP); Osamu Shimada, Fuchu (JP); Hiroyuki Hirai, Fuchu (JP); Yuji Yamaguchi, Tokyo (JP)

(73) Assignees: Dai Nippon Printing Co., Ltd., Tokyo (JP); D.T. Circuit Technology Co., Ltd., Tokyo (JP)

( * ) Notice: Subject to any disclaimer, the term of this patent is extended or adjusted under 35 U.S.C. 154(b) by 0 days.

(21) Appl. No.: 10/160,179

(22) Filed: Jun. 4, 2002

(65) Prior Publication Data

US 2002/0179329 A1 Dec. 5, 2002

(30) Foreign Application Priority Data

Jun. 5, 2001 (JP) ....................... 2001-170019
Jun. 5, 2001 (JP) ....................... 2001-170020

(51) Int. Cl.⁷ ............................ H05K 1/03; H05K 7/12
(52) U.S. Cl. ....................... 174/255; 174/261; 174/263; 361/767; 361/792
(58) Field of Search ...................... 361/760, 767, 361/770, 777, 792–795, 783, 737; 174/250, 255, 262–266; 257/679; 235/492

(56) References Cited

U.S. PATENT DOCUMENTS

| | | | | |
|---|---|---|---|---|
| 4,204,187 A | | 5/1980 | Kakuhashi et al. | |
| 4,737,747 A | * | 4/1988 | Henderson et al. | 333/246 |
| 4,870,746 A | | 10/1989 | Klaser | |
| 5,521,406 A | * | 5/1996 | Tserng et al. | 257/276 |
| 5,541,135 A | * | 7/1996 | Pfeifer et al. | 438/108 |
| 5,600,103 A | * | 2/1997 | Odaira et al. | 174/265 |
| 5,705,852 A | * | 1/1998 | Orihara et al. | 257/679 |
| 5,717,231 A | * | 2/1998 | Tserng et al. | 257/276 |
| 5,736,681 A | * | 4/1998 | Yamamoto et al. | 174/265 |
| 5,920,454 A | | 7/1999 | Nomura et al. | |
| 6,103,134 A | | 8/2000 | Dunn et al. | 216/17 |
| 6,310,304 B1 | * | 10/2001 | Hayama et al. | 174/264 |
| 6,317,023 B1 | | 11/2001 | Felten | 174/259 |
| 6,469,371 B2 | * | 10/2002 | Akagawa | 257/679 |
| 6,610,934 B2 | * | 8/2003 | Yamaguchi et al. | 174/264 |
| 6,631,551 B1 | | 10/2003 | Bowles et al. | 29/620 |
| 2003/0154592 A1 | | 8/2003 | Felten | 29/610.1 |

FOREIGN PATENT DOCUMENTS

| | | |
|---|---|---|
| EP | 0073904 A2 | 3/1983 |
| EP | 0409668 A2 | 1/1991 |

(List continued on next page.)

OTHER PUBLICATIONS

John J. Felten, et al., "Embedded Ceramic Resistors and Capacitors for PWB," IPC Printed Circuit Expo, San Diego, CA, Apr. 2000.

(List continued on next page.)

Primary Examiner—Alonzo Chambliss
(74) Attorney, Agent, or Firm—Finnegan, Henderson, Farabow, Garrett & Dunner, L.L.P.

(57) ABSTRACT

A fabricating method of a wiring board provided with passive elements is disclosed. The fabricating method includes coating one or both of resistive paste and dielectric paste on at least any one of first surfaces of a first metal foil and a second metal foil each of which has a first surface and a second surface; arranging an insulating board having thermo-plasticity and thermo-setting properties so as to face the first surface of the first metal foil, and arranging the first surface side of the second metal foil so as to face a surface different from a surface to which the first metal foil faces of the insulating board; forming a double-sided wiring board by stacking, pressurizing and heating the arranged first metal foil, insulating board, and second metal foil, and thereby integrating these; and patterning the first metal foil and/or the second metal foil.

16 Claims, 13 Drawing Sheets

FOREIGN PATENT DOCUMENTS

| | | |
|---|---|---|
| JP | 2-125692 | 5/1990 |
| JP | 2-153589 | 6/1990 |
| JP | 5-283866 | 10/1993 |
| JP | 8-195561 | 7/1996 |
| JP | 10-056251 | 2/1998 |
| JP | 11-26943 | 1/1999 |
| JP | 2001-15910 | 1/2001 |
| JP | 2001-096665 | 4/2001 |
| JP | 2001-168491 | 6/2001 |
| JP | 2003-92460 | 3/2003 |
| WO | WO 94/07349 | 3/1994 |

OTHER PUBLICATIONS

John J. Felten, et al., "Ceramic Resistors and Capacitors Embedded in PWB," IPC San Diego, Apr. 5, 2000.

John J. Felten, et al., "Ceramic Resistors and Capacitors Embedded in PWB," IMAPS, Denver, Apr. 29, 2000.

John J. Felten, et al., "Embedded Ceramic Passives in PWB: Process Development," IPC Printed Circuit Expo, Anaheim, CA, Apr. 2001.

John J. Felten, et al., "Ceramic Resistors and Capacitors Embedded in PWB's," IPC Expo, Apr. 3, 2001.

William Borland, "Designing for Embedded Passives," Printed Circuit Design, Aug. 2001.

William Borland, et al., "Thick Film Ceramic Capacitors and Resistors Inside Printed Circuit Boards," 34$^{th}$ International Symposium on Microelectronics (IMAPS), Oct. 9–11, 2001, Baltimore, MD.

John Felten, et al., "Embedded Ceramic Resistors and Capacitors in PWB: Process and Performance," Fall IPC Meeting, Oct. 11, 2001, Orlando, FL.

William J. Borland, et al., "Embedded Passive Components in Printed Wiring Boards, a Technology Review," to be published in CircuiTree Magazine, 2001.

Jiming Zhou, et al., "Embedded Passives Technology for PCBs: Materials, Design, and Process," IMAPS 2002 Conference, Denver, CO, Sep. 4–6, 2002.

John J. Felten, et al., "Advanced Embedded Passives Technologies—Putting Ceramic Components into Organic PWBs," Electronic Circuits World Convention, Paper No.:IPC31.

William Borland, et al., "Embedded Singulated Ceramic Passives in Printed Wiring Boards," IMAPS Advanced Technology Workshop on Passive Integration, Ogunquit, ME, Jun. 19–21, 2002.

William Borland, et al., "Ceramic Resistors and Capacitors Embedded in Organic Printed Wiring Boards," Proceedings of IPACK03; International Electronics Packaging Technical Conference and Exhibition, Jul. 6–11, 2003, Maui, Hawaii, USA, pp. 1–6.

William Borland, et al., "Integration of Ceramic Passives in Printed Wiring Board Substrates," DuPont Microcircuit Materials.

David S. Hollander, The Mystique Behind Miniaturization—Surface Mount Technology, QST, Oct. 1987, pp. 15–18.

Bryan P. Bergeron, "A Surface–Mount Technology Primer—Part 2," QST, Jan. 1991, pp. 27–30.

* cited by examiner

WIRING BOARD PROVIDED WITH PASSIVE ELEMENT AND CONE SHAPED BUMPS

BACKGROUND OF THE INVENTION

1. Field of the Invention

The present invention relates to a method for fabricating a wiring board provided with a passive element and to a wiring board provided with a passive element, in particular to a method for fabricating a wiring board provided with a passive element having an aptitude for improving characteristics of the passive element and to a wiring board provided with a passive element having an aptitude for improving characteristics of the passive element.

2. Description of the Related Art

As portable electronic devices become smaller in size, lighter in weight and thinner in thickness, smaller size chip components, such as L (inductor, coil), C (condenser, capacitor) and R (resistor), have been developed. Furthermore, by burying passive elements such as C and L in a wiring substrate, composite components have been developed. Such integration with a wiring substrate has been actively forwarded particularly in multi-layered ceramic substrates and adopted in, for instance, RF (radio frequency) modules for portable telephones.

A multi-layered ceramic substrate is fabricated by first preparing a necessary number of green sheets (ceramic material sheet before sintering) on which coil patterns and capacitor electrode patterns are formed by, for instance, printing a thick film of a conductive paste, followed by stacking these in a predetermined order and by performing simultaneous thermo-compression bonding and sintering.

Furthermore, a plurality of green sheets having different dielectric constants is prepared, and according to characteristics of a passive component to be incorporated, the green sheets are appropriately selected. This is performed by selecting a low dielectric constant green sheet that can set a high self-resonant frequency and secure a high Q-value for a ceramic material that constitutes an inductor, and a high dielectric constant green sheet for a ceramic layer that forms a capacitor, respectively. By use of such a combination, an LC composite component having higher function may be incorporated.

In the aforementioned technique, ceramics is used for wiring substrate material. It is expected that in future an operating frequency of an RF circuit that is used in a portable telephone may reach 10 to 20 GHz. In view of this, it is important from a viewpoint of product costs and so on that organic resins having lower relative dielectric constants are made available as the substrate material. As things are, when an organic resin that is lower in dielectric constant than the ceramics is used as a substrate material (inter-layer insulating layer), and passive elements such as capacitors and so on are incorporated similarly to the multilayer ceramic substrate, it is supposed that an element area may become larger and desired characteristics may not be obtained.

Furthermore, as to the so-called hybrid multi-layered substrates, there are the following reports. That is, first, according to characteristics of a passive element to be incorporated, a substrate material in which a dielectric material and a magnetic material are mingled with polymer is prepared. Thus obtained substrate material is etched, and thereby a patterned capacitor layer and a coil layer are formed. These are laminated in a predetermined order, and thereby a hybrid multi-layered substrate is obtained.

However, in this technique, the multi-layered substrate may warp due to the difference of characteristics such as thermal expansion coefficient and so on between the substrate materials. In addition, since only one specified kind of passive element may be formed in one layer, a design allowance when the passive elements are arranged is low. That is, it is inappropriate in obtaining a smaller size due to tendency to an increase in the number of layers as a whole.

Furthermore, there is another multi-layered organic resin substrate in which resistive paste, dielectric paste, and conductive paste are sequentially printed to incorporate R, L and C. However, since the paste that can be used in this case is restricted to kinds that allow completing heat treatment at temperatures lower than the heat resistance temperature of an organic resin that is used as an insulating layer, the desired characteristics may not be obtained in some cases.

SUMMARY OF THE INVENTION

The present invention is carried out in consideration of the aforementioned situations. That is, the present invention provides a method for fabricating a wiring board that is provided with passive elements having improved characteristics, and a wiring board that is provided with such passive elements.

A method for fabricating a wiring board provided with a passive element according to the present invention includes coating a resistive paste and/or a dielectric paste on at least any one of first surfaces of a first metal foil and a second metal foil each of which has the first surface and a second surface; arranging an insulating board having thermo-plasticity and thermo-setting properties so as to face the first surface of the first metal foil, and arranging the first surface side of the second metal foil so as to face a surface different from a surface to which the first metal foil faces of the insulating board; forming a double-sided wiring board by stacking, pressurizing and heating three, that is, the arranged first metal foil, insulating board, and second metal foil and thereby integrating these; and patterning the first metal foil and/or the second metal foil of the formed double-sided wiring board.

That is, resistive paste and dielectric paste are coated on a metal foil. Accordingly, these pastes can be heat-treated (such as, for instance, drying, sintering, and curing) irrespective of the heat resistance temperature of an insulating board. Thereafter, the metal foil having thus, for instance, heat-treated resistive element and dielectrics and the insulating board are laminated. Accordingly, a wiring board provided with passive elements having excellent characteristics can be obtained.

Furthermore, another method for fabricating a wiring board provided with a passive element according to the present invention includes coating a resistive paste on a first surface of at least a first metal foil of the first metal foil and a second metal foil each of which has the first surface and a second surface; forming a substantially conical conductive bump on a resistive element formed of the coated resistive paste; arranging an insulating board having thermo-plasticity and thermosetting properties so as to face the first surface of the first metal foil, and arranging the first surface of the second metal foil so as to face a surface different from a surface to which the first metal foil faces of the insulating board; forming a double-sided wiring board by stacking, pressurizing and heating three, that is, the arranged first metal foil, insulating board, and second metal foil and thereby integrating these so that the formed conductive bump may penetrate through the insulating board and establish an electrical contact and/or a heat conductive contact with the second metal foil; and patterning the first metal foil and the second metal foil of the formed double-sided wiring board.

That is, a resistive paste is coated on a metal foil. Accordingly, the heat-treatment (such as, for instance, drying, sintering, and curing) and so on of the paste can be performed irrespective of the heat resistance temperature of an insulating board. Thereafter, the metal foil having thus, for instance, heat-treated paste (resistive element) and the insulating board are laminated. Accordingly, a wiring board provided with passive elements (resistors in this case) having excellent characteristics can be obtained.

Furthermore, in this case, the wiring board may be configured so that the conductive bump may directly establish one or both of an electrical contact and a heat conductive contact with the coated/formed resistive element. Accordingly, since a lead wire can be pulled out of the resistive element while avoiding a contact between the resistive element and the metal foil, the resistive paste that is less compatible with a metal (for instance, copper) that is used for the metal foil may be used. Accordingly, by further expanding a range of choice of available resistive pastes, a wiring board provided with a passive element having excellent characteristics may be obtained. Furthermore, when the conductive bump is brought into a heat conductive contact with the resistive element, for instance, a heat sink may be disposed on a rear surface side (an opposite side from a surface side having a resistor thereon) of the insulating board.

Still furthermore, still another method for fabricating a wiring board provided with a passive element according to the present invention includes coating a dielectric paste on a first surface of at least a second metal foil of a first metal foil and the second metal foil each of which has the first surface and a second surface; coating a conductive paste so as to include on the coated dielectric paste and extend onto the first surface on which the dielectric paste is coated; arranging an insulating board having thermo-plasticity and thermosetting properties so as to face the first surface of the first metal foil, and arranging the first surface of the second metal foil so as to face a surface different from a surface to which the first metal foil faces of the insulating board; forming a double-sided wiring board by stacking, pressurizing and heating three, that is, the arranged first metal foil, insulating board, and second metal foil and thereby integrating these; and patterning at least the second metal foil of the formed double-sided wiring board.

That is, a dielectric paste is coated on a metal foil. Accordingly, heat-treatment (such as, for instance, drying, sintering, and curing) and so on of the paste can be performed irrespective of the heat resistance temperature of an insulating board. Thereafter, the metal foil having thus, for instance, heat-treated paste (dielectric material) and the insulating board are laminated. Accordingly, a wiring board provided with a passive element (capacitor in this case) having excellent characteristics can be obtained.

Furthermore, in this case, furthermore, an electrical conductor formed of the conductive paste and the metal foil may sandwich dielectrics, thereby a so-called parallel plate capacitor is formed. Thereby, a capacitor having higher capacitance may be formed.

Still furthermore, still another method for fabricating a wiring board provided with a passive element according to the present invention includes coating a dielectric paste on a first surface of at least a second metal foil of a first metal foil and the second metal foil each of which has the first surface and a second surface; coating a first conductive paste so as to contain on the coated dielectric paste and to extend onto the first surface on which the dielectric paste is coated; coating a second dielectric paste so as to contain on the coated first conductive paste; coating a second conductive paste so as to contain on the coated second dielectric paste, to extend onto the first surface on which the second dielectric paste is coated, and not to come into contact with the first conductive paste; arranging an insulating board having thermo-plasticity and thermosetting properties so as to face the first surface of the first metal foil, and arranging the first surface of the second metal foil so as to face a surface different from a surface to which the first metal foil faces of the insulating board; forming a double-sided wiring board by stacking, pressurizing and heating three, that is, the arranged first metal foil, insulating board, and second metal foil, and thereby integrating these; and patterning at least the second metal foil of the formed double-sided wiring board.

That is, a dielectric paste and a conductive paste are coated on a metal foil. Thereby, heat treatment (for instance, drying, sintering, and curing) of the pastes may be performed irrespective of the heat resistance temperature of an insulating board. Since the metal foil having thus, for instance, heat-treated paste (dielectric material) is laminated together with the insulating board, a wiring board provided with a passive element (capacitor in this case) excellent in characteristics can be obtained.

In this case, furthermore, since an electrical conductor made of the conductive paste and the metal foil may be formed to sandwich the dielectrics, and the electrical conductor and an electrical conductor made of the second conductive paste may be formed to sandwich the second dielectrics, a so-called parallel plate capacitor may be formed in multi-layers. Thereby, a capacitor having higher capacitance may be formed. Such a multi-layered capacitor, by forming dielectrics and an electrical conductor in a further multi-layered structure due to the dielectric paste and conductive paste, may be provided with furthermore higher capacitance.

Furthermore, still another method for fabricating a wiring board provided with a passive element according to the present invention includes forming a substantially conical conductive bump on a first surface of a first metal foil having the first surface and a second surface; forming a substantially conical magnetically permeable bump on a first surface of a second metal foil having the first surface and a second surface; arranging an insulating board having thermo-plasticity and thermosetting properties so as to face the first surface of the first metal foil, and arranging the first surface side of the second metal foil so as to face a surface different from a surface to which the first metal foil faces of the insulating board; forming a double-sided wiring board by stacking, pressurizing and heating three, that is, the arranged first metal foil, insulating board, and second metal foil, and thereby integrating these so that the formed conductive bump and magnetically permeable bump may penetrate through the insulating board and establish a contact with the first or second metal foil; and patterning the first metal foil and the second metal foil of the formed double-sided wiring board.

That is, a conductive bump and a magnetically permeable bump are formed on a metal foil. Accordingly, the bumps can be heat-treated (such as, for instance, drying, sintering, and curing) irrespective of the heat resistance temperature of an insulating board. Thereafter, the metal foil having thus, for instance, heat-treated bump and the insulating board are laminated. Accordingly, a wiring board provided with a passive element (in this case inductor) having excellent characteristics may be obtained.

Furthermore, in this case, furthermore, due to patterning of a first and second metal layers and due to an electrical connection between these by means of a conductive bump, a helical inductor with the magnetically permeable bump as a core may be formed. Accordingly, ones having larger inductance may be formed.

A wiring board provided with a passive element according to the present invention includes an insulating board having a first surface and a second surface; a layered resistive element and/or a layered dielectrics disposed on the first surface and/or the second surface of the insulating board so as to sink in a thickness direction of the insulating board; and a first wiring layer and a second wiring layer that are, respectively, disposed on the first surface and the second surface of the insulating board, and each of which has a connection with the layered resistive element/the layered dielectrics disposed on the corresponding first surface/second surface.

Furthermore, another wiring board provided with a passive element according to the present invention includes an insulating board having a first surface and a second surface; a layered resistive element disposed on the second surface of the insulating board so as to sink in a thickness direction of the insulating board; a first and second wiring layers disposed on the first surface and second surface of the insulating board, respectively; and a conductive bump that penetrates through the insulating board and is in an electrical connection and/or a heat conductive connection with the layered resistive element and the first wiring layer.

Still furthermore, still another wiring board provided with a passive element according to the present invention includes an insulating board having a first surface and a second surface; a layered electrical conductor disposed on the second surface of the insulating board so as to sink in a thickness direction of the insulating board; a layered dielectrics disposed in partial contact with a top surface of the layered electrical conductor so as to sink in a thickness direction of the insulating board; and a wiring layer that is disposed on the second surface of the insulating board and has individual connections with the layered electrical conductor and the layered dielectrics.

Furthermore, still another wiring board provided with a passive element according to the present invention includes an insulating board having a first surface and a second surface; a first and second wiring layers, respectively, disposed on the first surface and the second surface of the insulating board; a conductive bump that penetrates through the insulating board and is in an electrical connection with the first wiring layer and the second wiring layer; and a magnetically permeable bump that penetrates through the insulating board. In the above, the first wiring layer has a first pattern that surrounds the magnetically permeable bump, the second wiring layer has a second pattern that surrounds the magnetically permeable bump, and the first and second patterns are in an electrical continuity due to the conductive bump.

The wiring boards are ones that can be fabricated by the aforementioned respective fabricating methods.

BRIEF DESCRIPTION OF THE DRAWINGS

The invention is described with reference to the drawings, which are presented for the purpose of illustration only and do not limit the scope of the invention.

DETAILED DESCRIPTION OF THE INVENTION

Figure 1A:
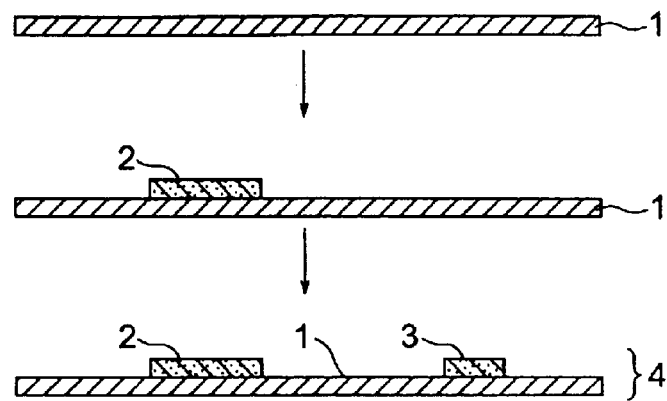
FIG. 1A and FIG. 1B are diagrams showing a process for fabricating a double-sided wiring board according to a fabricating method according to an embodiment of the present invention.

The fabricating method according to the present invention, as an implementation mode, further includes forming a substantially conical conductive bump on the first surface of the first metal foil. In this case, the forming a double-sided wiring board is performed so that the formed conductive bump may penetrate through the insulating board and establish an electrical contact with the second metal foil. That is, since wiring layers on both sides are electrically connected by means of a conductive bump, the number of the processes may be reduced and a double-sided wiring board whose wiring layers on both sides have an electrical continuity may be easily fabricated.

Furthermore, in an implementation mode of the fabricating method according to the present invention, the patterning the first metal foil and/or the second metal foil includes the formation of an inductor that is vortically formed due to a pattern and/or a loop antenna that is formed loop-like due to a pattern. That is, an inductor and a loop antenna are formed by patterning a metal foil.

Still furthermore, the fabricating method according to the present invention further includes trimming a resistor formed from the resistive paste by use of the patterned first metal foil and/or the patterned second metal foil as an electrode. That is, since an electrode can be formed to a resistor due to the patterning, by making use thereof for resistance measurement, is the resistor trimmed.

Furthermore, in an implementation mode of the fabricating method according to the present invention, the coating the resistive paste and/or the dielectric paste includes removing a periphery portion thereof after the coating. By removing irregularity at the edge portions of the coated resistive element and dielectrics, the resistor and capacitor having higher accuracy may be obtained.

Still furthermore, the fabricating method according to the present invention, as an implementation mode, further includes forming a substantially conical conductive bump on a first surface of a third metal foil having the first surface and a second surface; arranging a second insulating board having thermo-plasticity and thermosetting properties so as to face the first surface of the third metal foil, and arranging the first metal foil side of the double-sided wiring board so as to face a surface different from a surface that faces the third metal foil of the second insulating board; forming a three-layered wiring board by stacking, pressurizing and heating three, that is, the arranged third metal foil, second insulating board, and double-sided wiring board, and thereby integrating these so that the conductive bump formed on the third metal foil may penetrate through the second insulating board and establish an electrical contact with the first metal foil; and patterning the third metal foil of the formed three-layered wiring board.

That is, by use of a double-sided wiring board as a material, and by further establishing an interlayer connection with a third wiring layer due to a conductive bump, a three-layered wiring board is fabricated.

Still furthermore, the fabricating method according to the present invention, as an implementation mode, further includes coating a resistive paste and/or a dielectric paste on a first surface of a third metal foil having the first surface and a second surface; forming a substantially conical conductive bump on the first surface of the third metal foil; arranging a second insulating board having thermo-plasticity and thermosetting properties so as to face the first surface of the third metal foil, and arranging a first metal foil side of the double-sided wiring board so as to face a surface different from a surface that faces the third metal foil of the second insulating board; forming a three-layered wiring board by stacking, pressurizing and heating three, that is, the arranged third metal foil, second insulating board, and double-sided wiring board, and thereby integrating these so that the conductive bump formed on the third metal foil may penetrate through the second insulating board and establish an electrical contact with the first metal foil; and patterning the third metal foil of the formed three-layered wiring board.

That is, by use of a double-sided wiring board as a material, by further establishing an interlayer connection with a third wiring layer due to a conductive bump, a three-layered wiring board is fabricated. Here, a passive element may be enabled to use in the third wiring layer.

Furthermore, the fabricating method according to the present invention, as an implementation mode, further includes forming a substantially conical conductive bump on the second surface of the second metal foil of the formed double-sided wiring board; arranging a second insulating board having thermo-plasticity and thermosetting properties so as to face a side on which the conductive bump of the double-sided wiring board is formed, and arranging a third metal foil so as to face a surface different from a surface that faces the double-sided wiring board of the second insulating board; forming a three-layered wiring board by stacking, pressurizing and heating three, that is, the arranged double-sided wiring board, second insulating board, and third metal foil, and thereby integrating these so that the conductive bump formed on the double-sided wiring board may penetrate through the second insulating board and establish an electrical contact with the third metal foil; and patterning the third metal foil of the formed three-layered wiring board.

Also in this case, with a double-sided wiring board as a material, by further use of a conductive bump, an interlayer connection with a third wiring board is established, thereby forming a three-layered wiring board.

Still furthermore, the fabricating method according to the present invention, as an implementation mode, further includes coating a resistive paste and/or a dielectric paste on a first surface of a third metal foil having the first surface and a second surface; forming a substantially conical conductive bump on the second surface of the second metal foil of the formed double-sided wiring board; arranging a second insulating board having thermo-plasticity and thermosetting properties so as to face a side on which the conductive bump of the double-sided wiring board is formed, and arranging the first surface side of the third metal foil so as to face a surface different from a surface that faces the double-sided wiring board of the second insulating board; forming a three-layered wiring board by stacking, pressurizing and heating three, that is, the arranged double-sided wiring board, second insulating board, and third metal foil, and thereby integrating these so that the conductive bump formed on the double-sided wiring board may penetrate through the second insulating board and establish an electrical contact with the third metal foil; and patterning the third metal foil of the formed three-layered wiring board.

In this case too, by use of a double-sided wiring board as a material, by further establishing an interlayer connection with a third wiring layer due to a conductive bump, a three-layered wiring board is fabricated. Here, a passive element may be enabled to use in the third wiring layer.

Furthermore, in an implementation mode of the fabricating method according to the present invention, the patterning the third metal foil includes the formation an inductor that is vortically formed due to a pattern and/or a loop antenna that is formed loop-like due to a pattern. That is, by patterning the third metal foil, an inductor and a loop antenna may be formed.

Still furthermore, in an implementation mode of the fabricating method of the present invention, the coating a resistive paste and/or a dielectric paste on the first surface of the third metal foil includes removing a periphery portion thereof after the coating. This is a process to obtain a resistive element and dielectrics having higher accuracy from a resistive paste and dielectric paste coated on a third metal foil.

Furthermore, the fabricating method according to the present invention, as an implementation mode, further includes forming a substantially conical conductive bump on a first surface of a third metal foil having the first surface and a second surface; forming a substantially conical second conductive bump on the second surface of the second metal foil of the formed double-sided wiring board; arranging a second insulating board having thermo-plasticity and thermosetting properties so as to face the first surface of the third metal foil, arranging the first metal foil side of the double-sided wiring board so as to face a surface different from a surface to which the third metal foil faces of the second insulating board, arranging a third insulating board having thermo-plasticity and thermosetting properties so as to face a side on which the second conductive bump is formed of the double-sided wiring board, and arranging the fourth metal foil so as to face a surface different from a surface that faces the double-sided wiring board of the third insulating board; forming a four-layered wiring board by stacking, pressurizing and heating five, that is, the arranged third metal foil, second insulating board, double-sided wiring board, third insulating board, and fourth metal foil, and thereby integrating these so that the conductive bump formed on the third metal foil may penetrate through the second insulating board and establish an electrical contact with the first metal foil and the second conductive bump formed on the double-sided wiring board may penetrate through the third insulating board and establish an electrical contact with the fourth metal foil; and patterning the third metal foil and/or the fourth metal foil of the formed four-layered wiring board.

That is, by use of a double-sided wiring board as a material, by establishing an interlayer connection between the third and fourth wiring layers due to a conductive bump, a four-layered wiring board is fabricated.

Still furthermore, the fabricating method according to the present invention, as an implementation mode, further includes coating a resistive paste and/or a dielectric paste on at least any one of first surfaces of a third and fourth metal foils each of which has the first surface and a second surface; forming a substantially conical conductive bump on the first surface of the third metal foil; forming a substantially conical second conductive bump on the second surface of the second metal foil of the formed double-sided wiring board; arranging a second insulating board having thermo-plasticity and thermosetting properties so as to face the first surface of the third metal foil, arranging the first metal foil side of the double-sided wiring board so as to face a surface different from a surface to which the third metal foil faces of the second insulating board, arranging a third insulating board having thermo-plasticity and thermosetting properties so as to face a side on which the second conductive bump is formed of the double-sided wiring board, and arranging the first surface side of the fourth metal foil so as to face a surface different from a surface that faces the double-sided wiring board of the third insulating board; forming a four-layered wiring board by stacking, pressurizing and heating five, that is, the arranged third metal foil, second insulating board, double-sided wiring board, third insulating board, and fourth metal foil, and thereby integrating these so that the conductive bump formed on the third metal foil may penetrate through the second insulating board and establish an electrical contact with the first metal foil and the second conductive bump formed on the double-sided wiring board may penetrate through the third insulating board and establish an electrical contact with the fourth metal foil; and patterning the third metal foil and/or the fourth metal foil of the formed four-layered wiring board.

Also in this case, by use of a double-sided wiring board as a material, by further establishing an interlayer connection with a third and fourth wiring layer due to a conductive bump, a four-layered wiring board is fabricated. Even in the third and fourth wiring layers, passive elements may be utilized.

Furthermore, in an implementation mode of the fabricating method according to the present invention, the patterning the third metal foil and/or the fourth metal foil includes the formation of an inductor that is vortically formed due to a pattern and/or a loop antenna that is formed loop-like due to a pattern. That is, by patterning a third metal foil and a fourth metal foil, an inductor and a loop antenna may be formed.

Still furthermore, in an implementation mode of the fabricating method of the present invention, the coating a resistive paste and/or a dielectric paste on at least any one of the first surfaces of the third and fourth metal foils includes removing a periphery portion thereof after the coating. This is a process for obtaining a resistive element and/or dielectrics having higher accuracy from the resistive paste and the dielectric paste coated on the third metal foil and/or the fourth metal foil.

Furthermore, the fabricating method according to the present invention, as an implementation mode, further includes forming a substantially conical second conductive bump on a first surface of a third metal foil having the first surface and a second surface; forming a substantially conical second magnetically permeable bump on a first surface of a fourth metal foil having the first surface and a second surface; forming a substantially conical third conductive bump on the second surface of the second metal foil of the formed double-sided wiring board; forming a substantially conical third magnetically permeable bump on a surface of the first metal foil side of the formed double-sided wiring board; arranging a second insulating board having thermo-plasticity and thermosetting properties so as to face the first surface of the third metal foil, arranging a first metal foil side of the double-sided wiring board so as to face a surface different from a surface to which the third metal foil faces of the second insulating board, arranging a third insulating board having thermo-plasticity and thermosetting properties so as to face a side on which the third conductive bump is formed of the double-sided wiring board, and arranging the first surface side of a fourth metal foil so as to face a surface different from a surface that faces the double-sided wiring board of the third insulating board; forming a four-layered wiring board by stacking, pressurizing and heating five, that is, the arranged third metal foil, second insulating board, double-sided wiring board, third insulating board, and a fourth metal foil, and thereby integrating these so that the second conductive bump formed on the third metal foil may penetrate through the second insulating board and establish an electrical contact with the first metal foil, the second magnetically permeable bump formed on the double-sided wiring board may penetrate through the second insulating board and establish a contact with the third metal foil, the third conductive bump formed on the double-sided wiring board may penetrate through the third insulating board and establish an electrical contact with the fourth metal foil, and the third magnetically permeable bump formed on the fourth metal foil may penetrate through the third insulating board and establish a contact with a surface of the second metal foil side of the double-sided wiring board; and patterning the third metal foil and the fourth metal foil of the formed four-layered wiring board.

That is, by use of a magnetically permeable bump as a core, a helical inductor is attempted to form in the four-layered wiring board.

Furthermore, the fabricating method according to the present invention, as an implementation mode, further includes forming a through-hole in a formed double-sided wiring board and filling a magnetically permeable material in the formed through-hole. In place of the magnetically permeable bump, a pillar-like body formed by filling a magnetically permeable material in a through-hole may be used as a core of a helical inductor.

Furthermore, the fabricating method according to the present invention is a fabricating method of a wiring board provided with a passive element that, as an implementation mode, further includes forming a substantially conical conductive bump on the first surface of the first metal foil, and the forming a double-sided wiring board is performed so that the formed conductive bump may penetrate through the insulating board and establish an electrical contact with the second metal foil. The present fabricating method further includes forming a substantially conical second conductive bump on a first surface of a third metal foil having the first surface and a second surface; forming a substantially conical third conductive bump on the second surface of the second metal foil of the formed double-sided wiring board; arranging a second insulating board having thermo-plasticity and thermosetting properties so as to face the first surface of the third metal foil, arranging the first metal foil side of the double-sided wiring board so as to face a surface different from a surface to which the third metal foil faces of the second insulating board, arranging a third insulating board having thermo-plasticity and thermosetting properties so as to face a side on which the third conductive bump is formed of the double-sided wiring board, and arranging the fourth metal foil so as to face a surface different from a surface that faces the double-sided wiring board of the third insulating board; forming a four-layered wiring board by stacking, pressurizing and heating five, that is, the arranged third metal foil, second insulating board, double-sided wiring board, third insulating board, and fourth metal foil, and thereby integrating these so that the second conductive bump formed on the third metal foil may penetrate through the second insulating board and establish an electrical contact with the first metal foil and the third conductive bump formed on the double-sided wiring board may penetrate through the third insulating board and establish an electrical contact with the fourth metal foil; patterning the third metal foil and the fourth metal foil of the formed four-layered wiring board; forming a through-hole in the formed four-layered wiring board; and filling a magnetically permeable material in the formed through-hole.

In this case too, in place of the magnetically permeable bump, a pillar-like body that is formed by filling a magnetically permeable material in a through-hole is attempted to use as a core of a helical inductor. The wiring board has a four-layered wiring layer.

Furthermore, the wiring board according to the present invention, as an implementation mode, further includes a conductive bump that penetrates through the insulating board, wherein each of the first and second wiring layers has an electrical connection with the conductive bump. That is, since the electrical connection between the wiring layers on both sides is performed by use of a conductive bump, the present wiring board is a wiring board whose both wiring layers have an electrical continuity and enables to reduce the number of processes, that is, to realize higher productivity.

Furthermore, as an implementation mode of the wiring board according to the present invention, at least one of the first and second wiring layers has an inductor that is vortically formed due to a pattern and/or a loop antenna that is formed loop-like due to a pattern. That is, an inductor and a loop antenna are formed as a metal foil pattern.

Still furthermore, a wiring board according to the present invention, as an implementation mode, further includes a second insulating board disposed in contact with the first wiring layer side of the insulating board; a conductive bump that penetrates through the second insulating board; and a third wiring layer disposed on a side different from the insulating board side of the second insulating board; wherein the first wiring layer of the insulating board is disposed so as to sink in a thickness direction of the second insulating board; and each of the first and third wiring layers has an electrical connection with the conductive bump. This is a three-layered wiring board that contains a double-sided wiring board inside thereof and in which an interlayer connection with a third wiring layer is established by means of a conductive bump.

Still furthermore, a wiring board according to the present invention, as an implementation mode, further includes a second layered resistive element and/or a second layered dielectrics disposed on the third wiring layer side of the second insulating board so as to sink in a thickness direction of the second insulating board; wherein the third wiring layer has a connection with the second layered resistive element/the second layered dielectrics. Thereby, a passive element is made available even in a third wiring layer.

Furthermore, as an implementation mode of a wiring board according to the present invention, the third wiring layer has an inductor that is vortically formed due to a pattern and/or a loop antenna that is formed loop-like due to a pattern. That is, an inductor and a loop antenna are formed as a metal foil pattern.

Still furthermore, a wiring board according to the present invention further includes, as an implementation mode, a third insulating board disposed in contact with the second wiring layer side of the insulating board; a second conductive bump that penetrates through the third insulating board; and a fourth wiring layer disposed on a side different from the insulating board side of the third insulating board; wherein the second wiring layer of the insulating board is disposed so as to sink in a thickness direction of the third insulating board; and each of the second and fourth wiring layers has an electrical connection with the second conductive bump. This is a four-layered wiring board that contains a double-sided wiring board as a core wiring board and in which interlayer connections with third and fourth wiring layers are further implemented by means of conductive bumps.

Still furthermore, a wiring board according to the present invention further includes, as an implementation mode, a second layered resistive element and/or a second layered dielectrics disposed on the fourth wiring layer side of the third insulating board so as to sink in a thickness direction of the third insulating board; wherein the fourth wiring layer has a connection with the second layered resistive element/ the second layered dielectrics. Thereby, a passive element is made available even in third and fourth wiring layers.

Furthermore, as an implementation mode of a wiring board according to the present invention, the fourth wiring layer has an inductor that is vortically formed due to a pattern and/or a loop antenna that is formed loop-like due to a pattern. That is, an inductor and a loop antenna are formed as a metal foil pattern.

Still furthermore, a wiring board according to the present invention further includes, as an implementation mode, a second layered dielectrics disposed under a bottom surface of the layered electrical conductor and a second electrical conductor that is disposed including under the bottom surface of the second layered dielectrics and is brought into contact with the wiring layer. That is, the present wiring board includes a multi-layered parallel plate capacitor.

Furthermore, a wiring board according to the present invention, as an implementation mode, further includes a second insulating board disposed on the first wiring layer side of the insulating board; a third insulating board disposed on the second wiring layer side of the insulating board; a third wiring layer disposed on a different surface side from the insulating board of the second insulating board; a fourth wiring layer disposed on a different surface side from the insulating board of the third insulating board; a second conductive bump that penetrates through the second insulating board and is brought into electrical connections with the first wiring layer and the third wiring layer; a second magnetically permeable bump that penetrates through the second insulating board; a third conductive bump that penetrates through the third insulating board and is brought into electrical connections with the second wiring layer and the fourth wiring layer; and a third magnetically permeable bump that penetrates through the third insulating board; wherein the first wiring layer is disposed so as to sink in a thickness direction of the second insulating board; the second wiring layer is disposed so as to sink in a thickness direction of the third insulating board; the magnetically permeable bump, the second magnetically permeable bump and the third magnetically permeable bump are disposed in series; the third wiring layer has a third pattern that surrounds the second magnetically permeable bump; the fourth wiring layer has a fourth pattern that surrounds the third magnetically permeable bump; the first and third patterns are in an electrical continuity due to the second conductive bump; and the second and fourth patterns are in an electrical continuity due to the third conductive bump.

That is, by use of a magnetically permeable bump as a core, a helical inductance is formed in a four-layered wiring board.

Furthermore, a wiring board according to the present invention includes, as an implementation mode, in place of the magnetically permeable bump, the second magnetically permeable bump, and the third magnetically permeable bump, a pillared body that has a magnetically permeable material and penetrates through the insulating board, the second insulating board, and the third insulating board. That is, in place of a magnetically permeable bump as a core, a pillar having a magnetically permeable material is used as a core of a helical inductor.

Figure 1B:
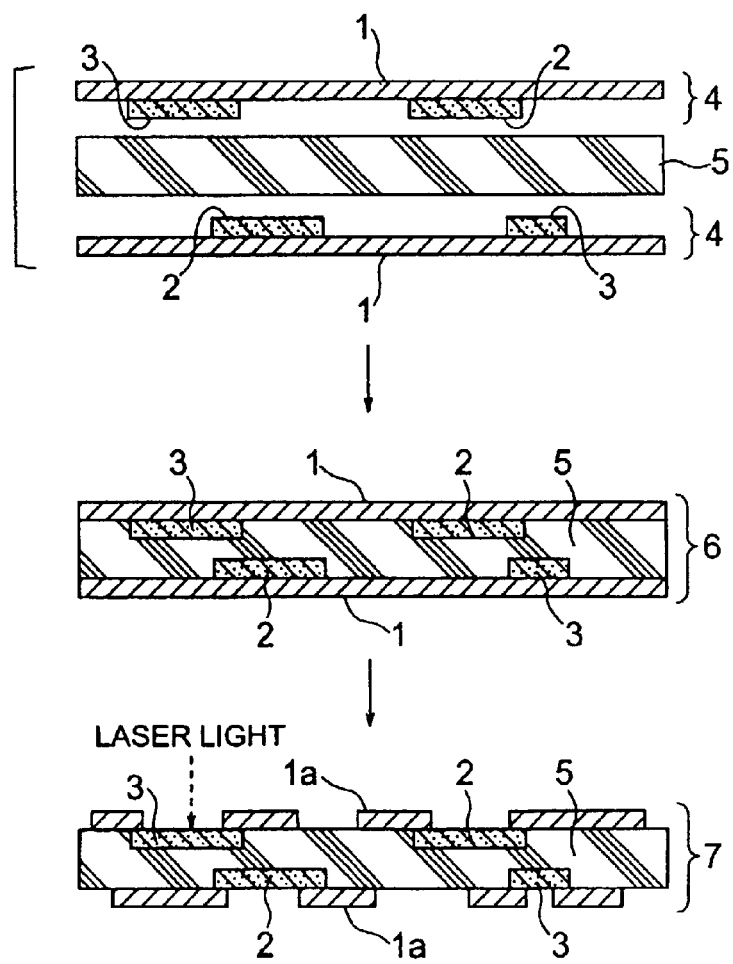

In the following, embodiments of the present invention will be explained with reference to the drawings. FIG. 1A and FIG. 1B are diagrams showing a process for fabricating a double-sided wiring board according to one embodiment of the present invention.

First, as shown in FIG. 1A upper side, a metal foil (a copper foil, for instance) 1 is prepared. On this metal foil 1, a dielectric paste is coated to be dielectrics 2 of a passive element (capacitor) necessary as a wiring board. Although a coating method is not particularly restricted, when, for instance, a screen-printing is used, over an entire surface, as many as necessary may be coated with high productivity and relatively high accuracy. As a dielectric paste, for instance, a composite in which powder of barium titanate, a high dielectric material is dispersed in a resinouos binder may be used. As an example, a dielectric paste CX-16, which is commercially available from ASAHI Kagaku Kenkyusho, may be utilized.

Furthermore, on the metal foil 1, a resistive paste is coated to be a resistive element 3 of a passive element (resistor) necessary as a wiring board. The coating method of the resistive paste is also identical as that mentioned above. As a resistive paste, for instance, a composite in which resistive material powder is dispersed in a resinouos binder may be used. As an example, resistive pastes TU-15-8, TU-50-8, or TU-100-8, which are commercially available from ASAHI Kagaku Kenkyusho, may be utilized.

It is generally better to separately coat a dielectric paste and a resistive paste followed by separately drying and so on. It is because after the drying, a former coating state, without being interfered, may be maintained. The processing such as the drying and so on may be performed, irrespective of a heat resistance temperature of an insulating board (organic material) to be referred to later, at temperatures adequate for processing each of the dielectric paste and the resistive paste. Accordingly, since a range of choice of kinds thereof is wide, it contributes in the formation of a passive element having higher accuracy.

Figure 14A:
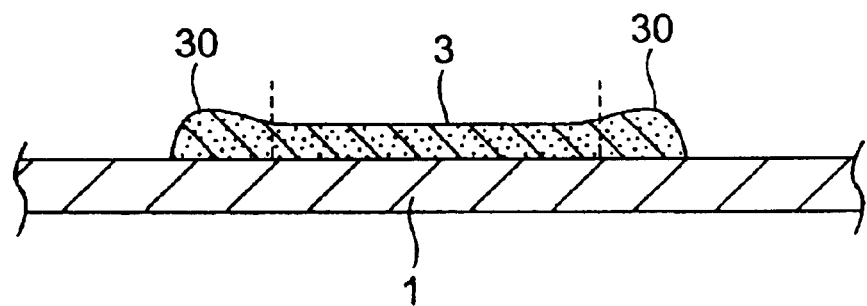
FIG. 14A and FIG. 14B are diagrams for explaining irregularity in the shape at a periphery of the dielectrics/resistive element/electrical conductor coated on the metal foil and an improvement thereof.
Figure 14B:
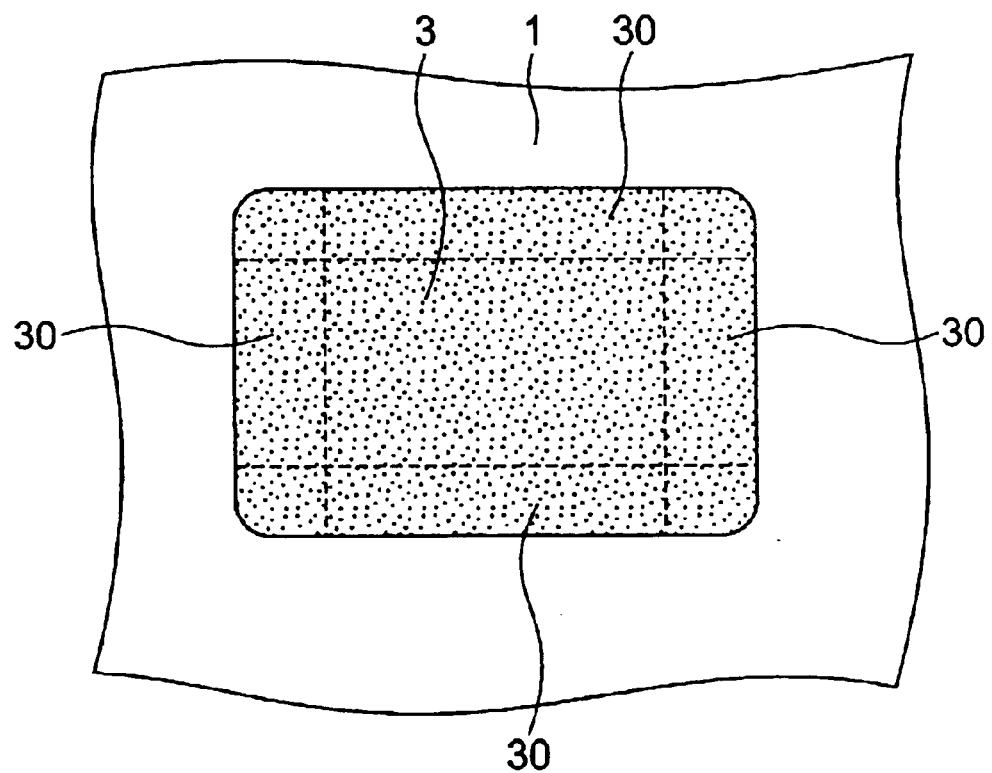

Furthermore, in order to make the resistive element 3 furthermore accurate, a method (post-treatment) as shown in FIG. 14A and FIG. 14B may be used. FIG. 14A and FIG. 14B are diagrams for explaining irregularity in the shape at a periphery portion of the resistive element (/dielectrics/electrical conductor) formed on a metal foil and an improvement thereof. FIG. 14A is a sectional view and FIG. 14B is a top view thereof.

In the resistive element 3 coated by means of the screen-printing and so on, in general, as shown in FIG. 14A, a shape, such as a thickness at the periphery thereof is formed a little differently from that of an inside portion (edge effect). Such a thickness variation may cause irregularity in a sheet resistance value (one of characteristic value of a resistive element; a resistance value between opposite sides of a square). Accordingly, edge portions 30 of the resistive element 3 are removed when the resistive element 3 is formed on the metal foil 1. In such removal, for instance, laser beam may be used. Since, due to such the removal, a thickness is more homogenized, a resistive element having a resistance value closer to that expected from the sheet resistance value may be formed. In the case of the dielectrics 2, accuracy is obtained similarly.

As mentioned above, a coated and formed metal foil 4 on a surface of which the resistive element 3 and the dielectrics 2 are formed is formed. Next, as shown in FIG. 1B upper side, resistive element 3/dielectrics 2 sides of two coated and formed metal foils 4 are arranged at a predetermined position necessary as a wiring board so as to face both sides of a prepreg to be an insulating board 5. The prepreg is obtained by impregnating a curable resin such as, for instance, epoxy resin in a reinforcing material such as glass fiber. Before curing, it is in a semi-cured state and has thermo-plasticity and thermo-setting properties.

Next, as shown in FIG. 1B center, three, that is, the coated/formed metal foil 4, insulating board 5 and another coated/formed metal foil 4 are stacked, pressurized and heated and thereby integrating these, a double-sided wiring board 6 is obtained. In the double-sided wiring board 6, the dielectrics 2 and the resistive element 3 are integrated so as to sink in a thickness direction of the insulating board 5. This is due to the thermo-plasticity and thermo-setting properties of the prepreg to be the insulating board 5.

Next, as shown in FIG. 1B lower side, the metal foils 1 on both sides are patterned into patterns 1a necessary as a wiring board. Due to the patterning, a double-sided wiring board 7 on which at least both end electrodes of the dielectrics 2 and the resistive element 3 are formed may be obtained. In the patterning, existing methods such as, for instance, the formation of a mask due to coating of photo-resist and exposure thereof, etching of the metal foil 1 due to the mask, and so on may be used.

In addition, the resistive element 3 may be trimmed by use of the both end electrodes formed by the patterning as resistance value measuring terminals. The trimming is a process in which, for instance, by use of laser light, the resistive element 3 is partially burned and brought to conform to a predetermined resistance value.

Although processes following the above are not shown in the drawings, the formation of solder resist and plating layers including on the pattern 1a, mounting of surface-mounting components on the pattern 1a, or flip-chip mounting of semiconductor chips may be implemented according to existing methods. Furthermore, as well known, a through-hole is bored in a double-sided wiring board 7, a conductive layer is formed on an internal surface thereof, and thereby the double-sided wiring board 7 having an electrical continuity between both wiring layers thereof may be formed. Still furthermore, according to the aforementioned etching of the metal foil 1, a vortical inductor may be formed. In this case, such a through-hole may be utilized as an inside terminal.

In the aforementioned embodiments, since materials are selected from a wide range of choice and the dielectrics 2 and the resistive element 3 are previously formed from the selected materials on the metal foil 1, on the same layer, a capacitor and resistor excellent in characteristics may be formed in a mingled state. Furthermore, since an organic material is used as the insulating board 5, lighter weight may be realized than in the case of ceramics.

In the aforementioned explanation, each of the dielectrics 2 to be a capacitor, and the resistive element 3 to be a resistor is formed by coating a paste-like composite. However, other than this, when a vortical inductor is formed, a conductive paste may be previously coated vortically as a paste-like composite on a metal foil 1.

Figure 2A:
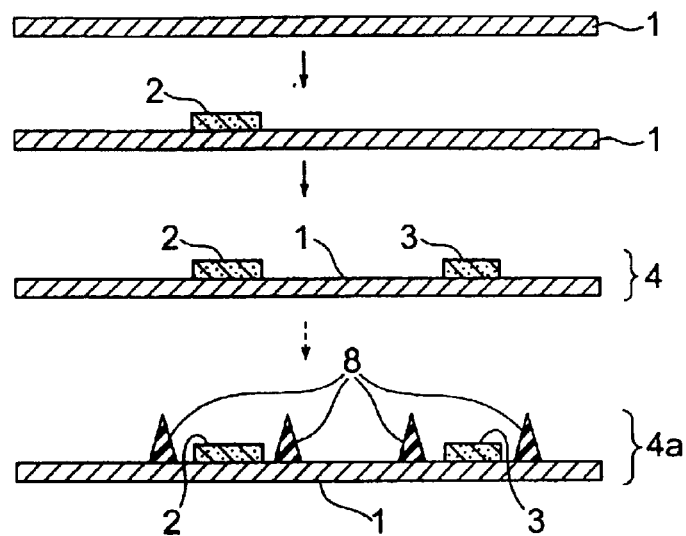
FIG. 2A and FIG. 2B are diagrams showing a process for fabricating a double-sided wiring board according to a fabricating method according to another embodiment of the present invention.
Figure 2B:
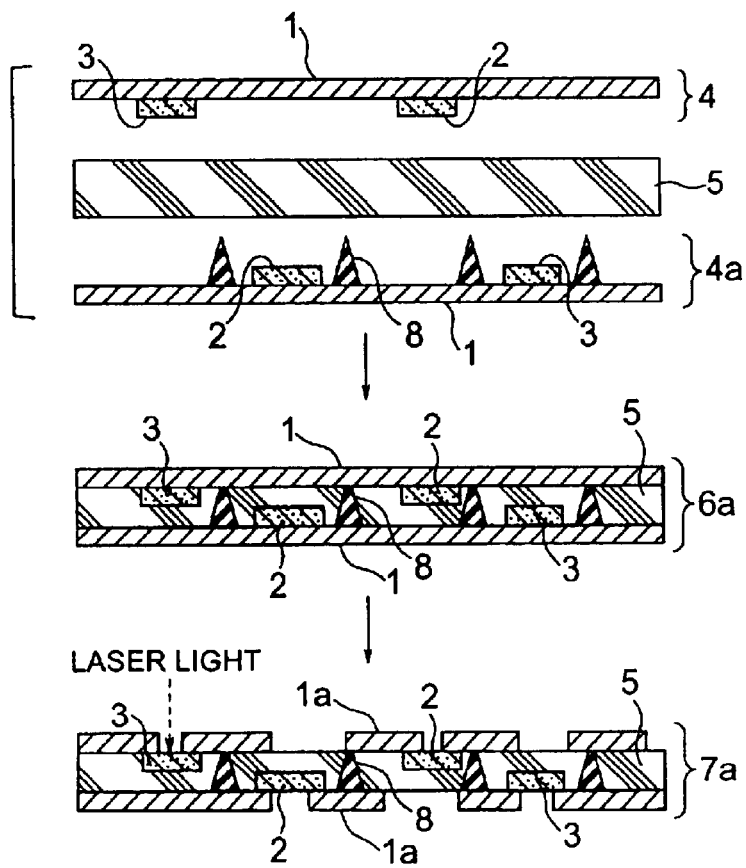

Next, a process for fabricating a double-sided wiring board according to a fabricating method according to another embodiment of the present invention will be explained with reference to FIG. 2A and FIG. 2B. FIG. 2A and FIG. 2B are diagrams showing a process for fabricating a double-sided wiring board according to a fabricating method according to another embodiment of the present invention. The same regions as FIG. 1A and FIG. 1B are given the same reference numerals. Explanation of the same regions will be omitted.

This embodiment is different from one shown in FIG. 1A and FIG. 1B in that as shown in FIG. 2A lower side, a process in which the coated/formed metal foil 4 is transformed into a conductive bump formed metal foil 4a on which conductive bumps 8 have been formed is added.

The conductive bump 8 may be formed on a place necessary as a wiring board on the coated/formed metal foil 4a by means of, for instance, screen printing. For this, as a conductive paste, for instance, one that is prepared by dispersing metal particles (silver, gold, copper, solder and so on) in a paste-like resin followed by mixing a volatile solvent is coated on the metal foil 4 by means of screen printing. The conductive bump 8 is necessary to have a height enough to penetrate through the insulating board 5 as will be detailed later. Accordingly, when one time screen-printing cannot give a necessary height, by repeating the screen-printing a plurality of times while disposing a drying process between the consecutive screen-printings, a height is increased and thereby forming a substantially conical shape as a whole is performed.

After the conductive bump formed metal foil 4a is obtained as shown in the above, next, as shown in FIG. 2B upper side, a resistive element 3 and dielectrics 2 side of the coated/formed metal foil 4 is disposed so as to face one side of both sides of the prepreg to be a insulating board 5, and a resistive element 3, dielectrics 2 and conductive bump 8 side of the conductive bump formed metal foil 4a is disposed so as to face the other side of both sides of the prepreg.

Next, as shown in FIG. 2B center, a double-sided wiring board 6a is obtained by stacking, pressurizing and heating three, that is, the coated/formed metal foil 4, insulating board 5, and conductive bump formed metal foil 4a, and thereby integrating these. In the double-sided wiring board 6a, the dielectrics 2 and resistive element 3 are integrated so as to sink in a thickness direction of the insulating board 5, and the conductive bump 8 penetrates through the insulating board 5 and comes into an electrical contact with the opposing metal foil 1. Such a state is realized because, as mentioned above, the insulating board 5 had thermo-plasticity and thermo-setting properties, and the conductive bump 8 is originally formed into a substantial cone.

In the double-sided wiring board 6a, since an electrical continuity between both wiring layers is established by the conductive bump 8, there is no need of a further process such as the formation of a through-hole to establish an electrical continuity between both wiring layers. Accordingly, since a space for the formation of the through-hole is not necessary, a wiring board of higher density may be obtained. Furthermore, in the integrating process, since a pressure on the dielectrics 2 and the resistive element 3 may be alleviated by the conductive bump 8 that works as a support, there is an advantageous effect that dispersions of various characteristics of the dielectrics 2 and the resistive element 3 that are caused at the integration may be suppressed.

Following the above, as shown in FIG. 2B lower side, the metal foils 1 on both sides are patterned into a pattern 1a necessary as a wiring board (substantially similar to the case of FIG. 1B lower side). Due to the patterning, a double-sided wiring board 7a in which both end electrodes of the dielectrics 2 and the resistive element 3 are at least formed may be obtained. In addition to this, the resistive element 3 may be trimmed by use of the both end electrodes formed by this patterning as resistance value measurement terminals. This is also as explained above.

Furthermore, although the processes following the above are not shown in the drawings, the formation of solder resist and plating layers including on the pattern 1a, mounting of surface-mounting components on the pattern 1a, or flip-chip mounting of semiconductor chips and so on may be performed according to existing methods. Still furthermore, according to the etching of the metal foil 1 as mentioned above, a vortical inductor may be formed. In this case, the above-explained conductive bump 8 may be utilized as an inside terminal.

In the above-explained embodiment, similarly to the embodiment explained in FIG. 1A and FIG. 1B, since materials are selected from a large choice of materials and the dielectrics 2 and the resistive element 3 are formed previously on the metal foil 1, a capacitor and resistor excellent in characteristics may be incorporated in the same layer in a mingled state. Furthermore, since an organic material is used as the insulating board 5, lighter weight may be realized than in the case of ceramics. Furthermore, in order to form a vortical inductor, in advance the conductive paste may be vortically coated on the metal foil 1.

Figure 3:
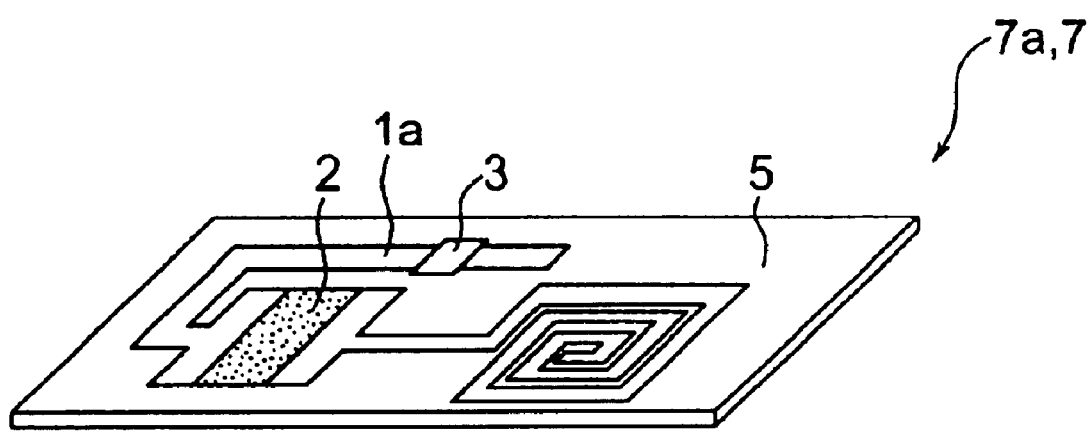
FIG. 3 is a perspective view showing an example of the double-sided wiring board fabricated by the process shown in FIG. 1A and FIG. 1B, or FIG. 2A and FIG. 2B.

FIG. 3 is a perspective view showing the double-sided wiring board 7 that can be formed according to the embodiment explained in FIG. 1A and FIG. 1B, or the double-sided wiring board 7a that can be formed according to the embodiment explained in FIG. 2A and FIG. 2B. As shown in FIG. 3, on both sides (one side may be allowed) of the insulating board 5, a resistor due to the resistive element 3, a capacitor due to the dielectrics 2, and a vortical inductor due to the pattern 1a may be incorporated in a state previously provided to the wiring boards 7/7a. By making use of the wiring pattern 1a as a land to mount surface mount components and semiconductor devices on both sides of the double-sided wiring board 7a, it may be of course used as a mounted wiring board as it is.

Figure 4A:
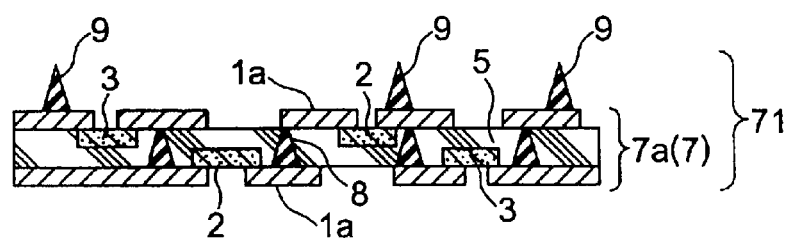
FIG. 4A and FIG. 4B are diagrams showing a process for making the double-sided wiring board that is fabricated by the process shown in FIG. 1A and FIG. 1B, or FIG. 2A and FIG. 2B into a material of a three-layered or four-layered material.
Figure 4B:
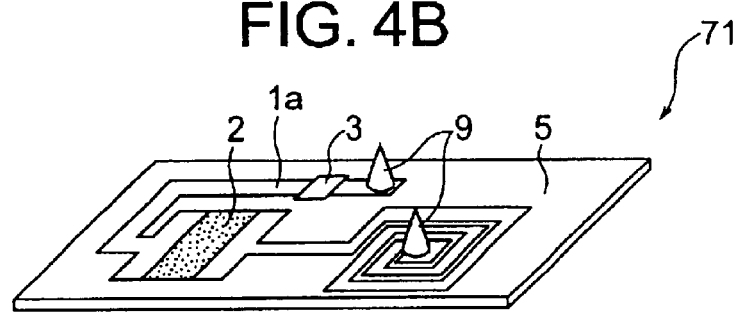
Figure 5A:
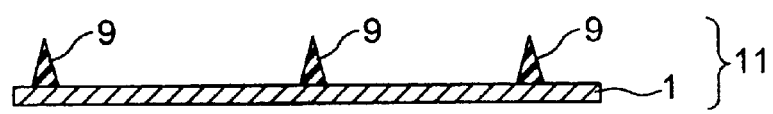
FIG. 5A and FIG. 5B are diagrams showing a metal foil necessary when the three-layered wiring board or four-layered wiring board is fabricated by use of the double-sided wiring board that is fabricated by the process shown in FIG. 1A and FIG. 1B, or FIG. 2A and FIG. 2B, and a process applied thereon.
Figure 5B:
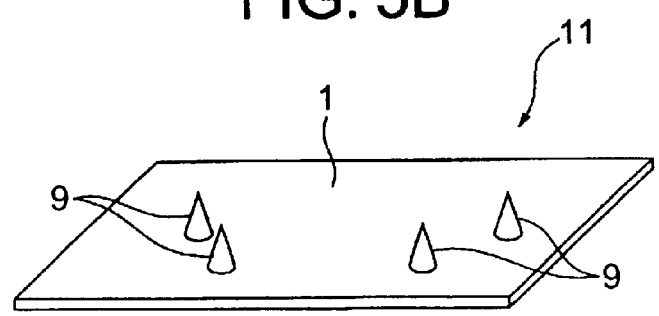

FIG. 4A and FIG. 4B are diagrams showing a process carried out to make the double-sided wiring board 7a (7) that is fabricated according to the process shown in FIG. 1A and FIG. 1B, or FIG. 2A and FIG. 2B a material of a four-layered wiring board. FIG. 4A is a sectional view, and FIG. 4B is a perspective view. FIG. 5A and FIG. 5B are diagrams showing a necessary metal foil when a four-layered wiring board is fabricated with the double-sided wiring board 7a (7) fabricated according to the process shown in FIG. 1A and FIG. 1B, or FIG. 2A and FIG. 2B and a process applied thereon. FIG. 5A is a sectional view, and FIG. 5B is a perspective view. Furthermore, already explained regions in these figures are given the same reference numerals. An N-layered wiring board is a wiring board in which the number of the wiring layers is N.

First, as shown in FIG. 4A and FIG. 4B, in order to use the double-sided wiring board 7a (7) as a core wiring board, conductive bumps 9 are formed on necessary positions on one side thereof (positions according to a layout as a particular four-layered wiring board). The formation of the conductive bumps 9 may be implemented substantially similarly to the already mentioned formation of the conductive bump 8. Thereby, a wiring board material 71 having the conductive bumps 9 is formed.

At the same time, as shown in FIG. 5A and FIG. 5B, a metal foil 1 to be the third wiring layer is prepared, and at necessary positions on the single side thereof (positions according to a layout as a particular four-layered wiring board) the conductive bumps 9 are formed. The formation of the conductive bumps 9 is performed also similarly to the above. Thereby, a metal foil 11 having the conductive bumps 9 is formed.

Figure 6:
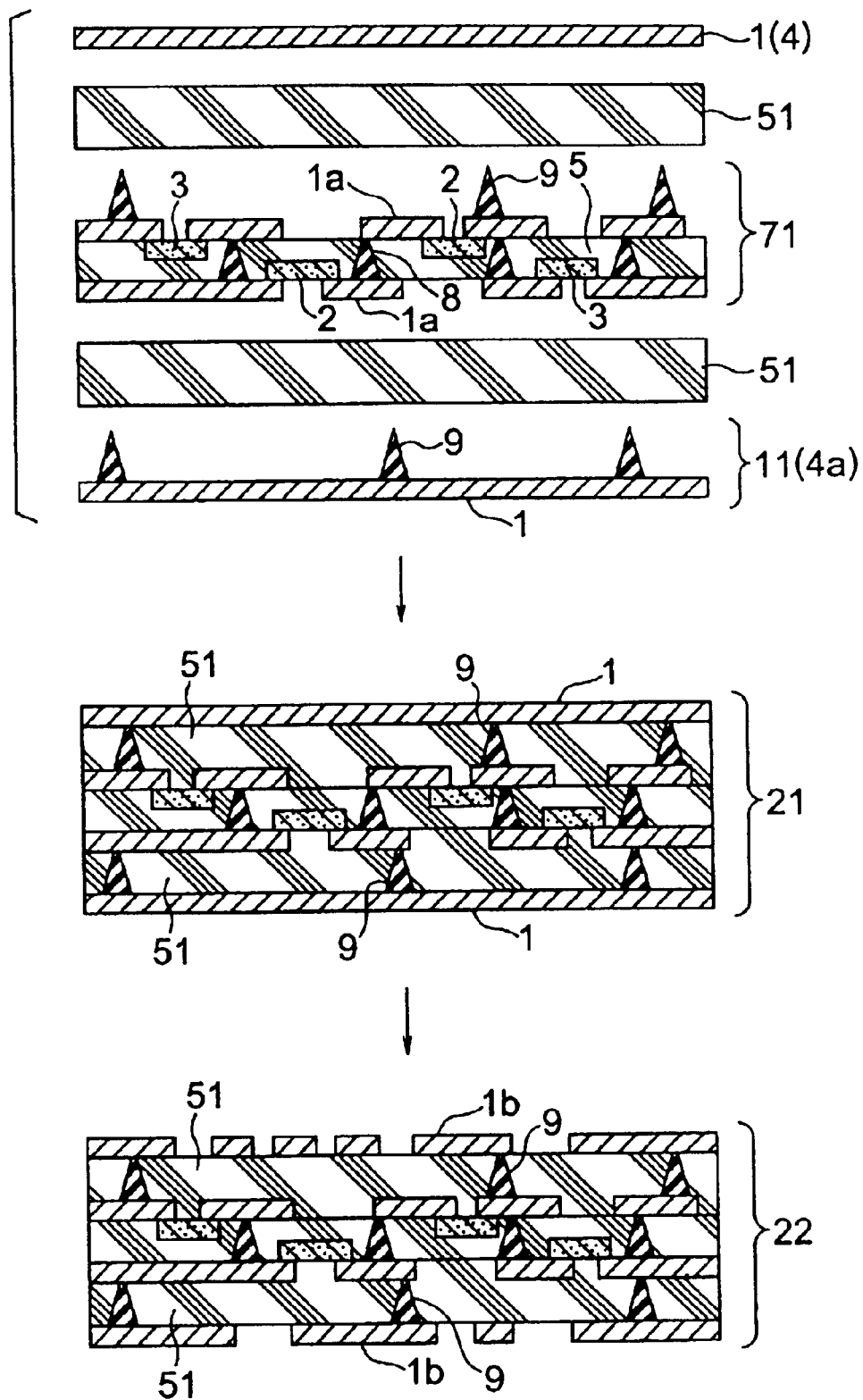
FIG. 6 includes diagrams showing a process for fabricating the four-layered wiring board by use of a wiring board material that is fabricated by the process shown in FIG. 4A and FIG. 4B, and the metal foil shown in FIG. 5A and FIG. 5B.
Figure 7:
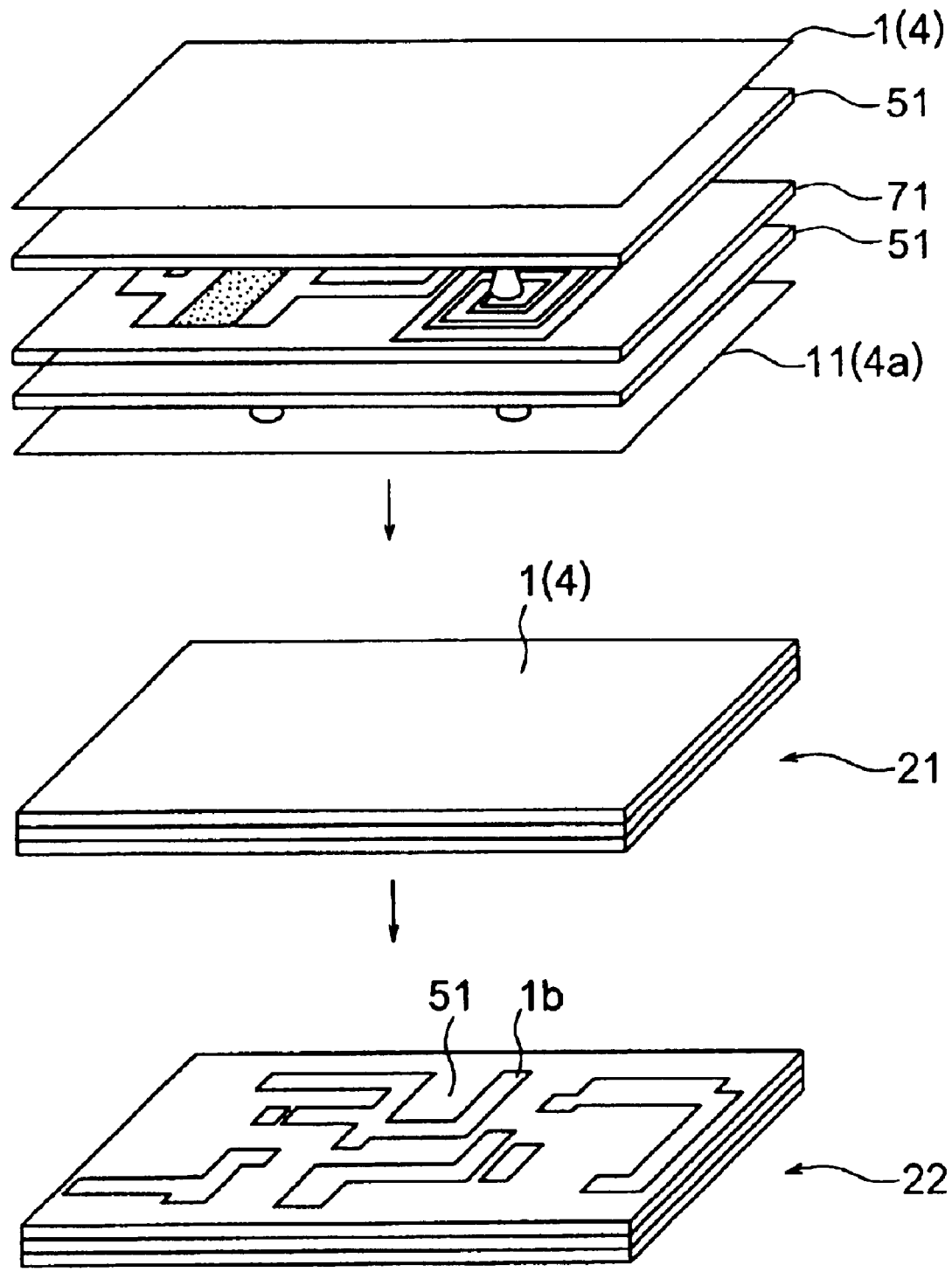
FIG. 7 includes perspective views showing the process shown in FIG. 6.

FIG. 6 includes diagrams showing a process for fabricating a four-layered wiring board by use of the wiring board material 71 fabricated by the process shown in FIG. 4A and FIG. 4B and the metal foil 11 shown in FIG. 5A and FIG. 5B as materials. FIG. 7 includes perspective views showing the process shown in FIG. 6. In FIG. 6 and FIG. 7, the already explained regions are given the same reference numerals.

As shown in FIG. 6 upper side and FIG. 7 upper side, respectively, first, the metal foil 1 is disposed through a prepreg to be an insulating board 51 so as to face a surface on which the conductive bumps 9 are formed of the wiring board material 71, and a side on which the conductive bumps 9 are formed of the metal foil 11 is disposed through the prepreg to be the insulating board 51 so as to face a surface on which a conductive bump 9 is not formed of the wiring board material 71. The prepreg to be the insulating board 51 may be one similar to the above-mentioned prepreg to be the insulating board 5.

Next, as shown in FIG. 6 center and FIG. 7 center, a four-layered wiring board 21 is obtained by stacking, pressurizing and heating five, that is, the metal foil 1, insulating board 51, wiring board material 71, insulating board 51, and metal foil 11, and thereby integrating these. In the double-sided wiring board 21, each of the wiring patterns 1a on both sides of the wiring board material 71 is integrated so as to sink in a thickness direction of the insulating boards 51, and the conductive bumps 9 penetrate through the each of the insulating boards 51 and come into an electrical contact with the opposing metal foil 1 or the pattern 1a. Such a state is realized because the insulating boards 51 had thermoplasticity and thermo-setting properties, and the conductive bumps 9 are originally formed in substantial cone.

In the four-layered wiring board 21, since an electrical continuity between an outer wiring layer and an inner wiring layer is established by means of the conductive bumps 9, there is no need of performing a further process such as through-hole formation for establishing an electrical continuity between these. Accordingly, since a space for use in through-hole formation is not necessary, a higher density four-layered wiring board may be obtained. In addition, in view of not adversely affecting on the layout of the other layers, needlessness of the through-hole formation is more significant as the number of wiring layers increase.

Next, as shown in FIG. 6 lower side and FIG. 7 lower side, the metal foils 1 on both sides of the four-layered wiring board 21 are patterned into a pattern 1b necessary as a wiring board. Due to the patterning, a four-layered wiring board 22 is formed. In the patterning, as mentioned above, existing methods may be used, and due to the patterning a vortically shaped inductor may be formed.

Furthermore, although the processes following the above are not shown by means of the drawings, the formation of solder resist and plating layers including on the pattern 1b, mounting of surface-mounting components on the pattern 1b, or flip-chip mounting of semiconductor chips may be implemented according to existing methods.

In the above-explained embodiments, an explanation is given for a case where a four-layered wiring board is fabricated with the double-sided wiring board 7a (7) obtained according to the fabricating method that is explained in FIG. 1A and FIG. 1B, or FIG. 2A and FIG. 2B as a core wiring board. Accordingly, the four-layered wiring board may be fabricated while maintaining features as the already-explained double-sided wiring board 7a (7). In addition, since the insulating board 51 that is an organic material is used when forming into a multi-layered structure, the formed multi-layered wiring board may be made lighter than ceramic one.

In the above explanation, a four-layered wiring board is fabricated by use of the double-sided wiring board 7a (7). A three-layered wiring board may be substantially similarly fabricated. That is, as one method, in FIG. 6 upper side, when three from the top (three of metal foil 1, insulating board 51 and wiring board material 71) is stacked, pressurized and heated and thereby these are integrated, a three-layered wiring board is obtained. Furthermore, as another method, in FIG. 6 upper side one, by stacking, pressurizing and heating three from the bottom (since in this case, the conductive bump 9 on the wiring board material 71 is unnecessary, the three is the wiring board material 7a (7), insulating board 51 and metal foil 11), and thereby integrating these, a three-layered wiring board is obtained.

Even in such a three-layered wiring board, a three-layered wiring board may be realized while maintaining features as the above-explained double-sided wiring board 7a (7).

Furthermore, in the above explanation, cases where passive elements are not previously incorporated in the third and fourth wiring layers of the four-layered wiring board and in the third wiring layer of the three-layered wiring board are explained. However, in FIG. 6 upper side one, by use of the coated/formed metal foil 4 (the formation surface of the passive element is used directed downward) shown in FIG. 1A or FIG. 2A in place of the upper side metal foil 1, and by use of the conductive bump formed metal foil 4a shown in FIG. 2A in place of the metal foil 11, passive elements may be incorporated in the third and fourth wiring layers.

According to these, the four-layered wiring board 22 may be formed in the shape where the third and fourth wiring layers of the four-layered wiring board 22 are previously provided with the resistor due to the resistive element 3 and the capacitor due to the dielectrics 2. Since the resistors and capacitors with which the third and fourth wiring layers are provided are also previously formed on the metal foil 1 before the stacking, there are the advantages similar to the resistor and the capacitor with which the first and second wiring layers are provided. Furthermore, the resistors with which the third and fourth wiring layers are provided may be also trimmed by use of the pattern 1b. In addition, by previously coating a vortical conductive paste on the metal foil 1, the inductor due to the conductive paste may be formed on the third and fourth wiring layers.

Furthermore, when the above-explained method is repeated and used, a wiring board having wiring layers exceeding four layers may be easily formed. When, for instance, a six-layered wiring board is fabricated, in FIG. 6 upper side one, in place of the wiring board material 71, one in which the conductive bumps are formed on a single side of the flour-layered wiring board 22 may be utilized. According to such repetition, furthermore multi-layered wiring boards are obtained.

Figure 8:
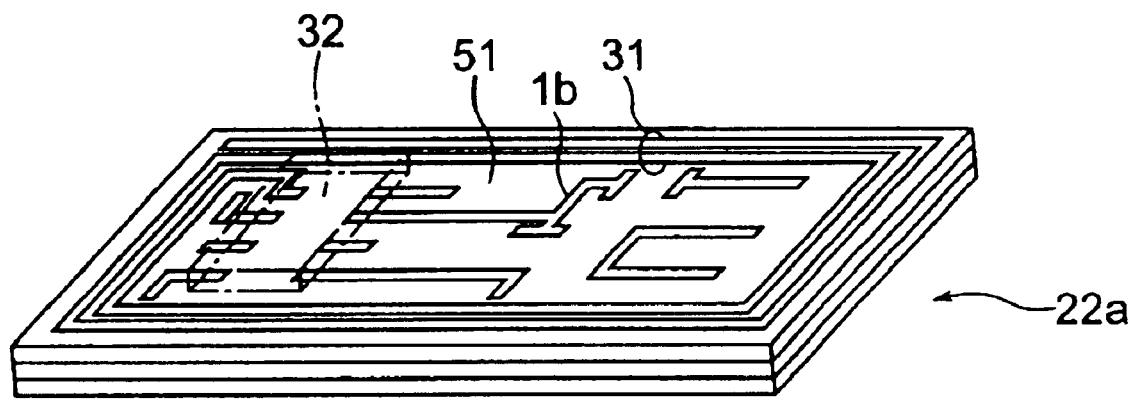
FIG. 8 is a perspective view showing the four-layered wiring board fabricated according to the fabricating method shown in FIG. 6 (FIG. 7) and having a loop antenna in an outer wiring.

FIG. 8 is a perspective view showing an example of the four-layered wiring board fabricated according to the fabricating method shown in FIG. 6 and FIG. 7. In the four-layered wiring board 22a in this example, by use of the pattern 1b of the outer wiring layer, a land for mounting a semiconductor device 32 and surface-mount components is formed, and a loop antenna 31 is formed near an outer periphery of the four-layered wiring board 22a.

Thereby, the semiconductor device 32, the loop antenna 31 and the passive elements (ones that are incorporated in the wiring board and surface-mounted components) necessary for, for example, an IC card (integrated circuit card) that delivers information via radio are integrated and formed into a four-layered wiring board. The formation of the loop antenna 31 by use of such the pattern may be performed by use of the pattern 1a on the double-sided wiring board 7 (7a) already described in FIG. 1B or FIG. 2B.

Figure 9:
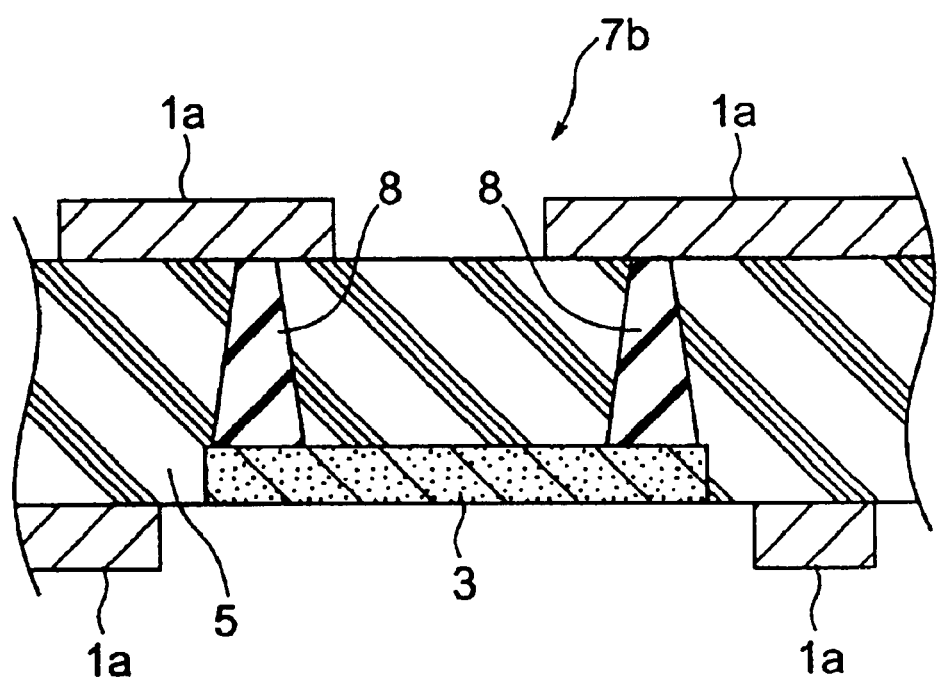
FIG. 9 is a partial sectional view as an example of a double-sided wiring board fabricated according to the fabricating method according to still another embodiment of the present invention.

FIG. 9 is a partial sectional view as an example of the double-sided wiring board fabricated according to the fabricating method according to still another embodiment of the present invention. Constituent elements that are already explained are given the same reference numerals.

This double-sided wiring board 7b is different from one shown in FIG. 2B in that as a lead wire of the resistive element 3, a conductive bump 8 that penetrates through the insulating board 5 is in direct use. In order to fabricate a double-sided wiring board in such a configuration, when the metal foil 4a shown in FIG. 2A is formed, the position of the conductive bump 8 need only be set so that it may be formed on the resistive element 3 of the metal foil 1.

Then, as shown in FIG. 2B, these are laminated and followed by patterning the metal foils 1 on both sides. In the patterning, the metal foil 1 on a side in contact with the resistive element 3 is patterned so that the metal foil 1 may not completely come into contact with the resistive element 3.

In thus configured resistor, since a lead wire thereof is not a metal used in the metal foil 1, without considering compatibility with the metal a resistive paste to be the resistive element 3 may be selected. The compatibility shows difficulty with which chemical and physical changes occurs at interfaces of, for instance, the metal (for instance, copper) of the metal foil 1 and the resistive element 3 when these come into contact. Bad compatibility may cause earlier corrosion on any one of these. In the present embodiment, since it is not necessary to consider the compatibility at least with the metal foil 1, a range of choice of the resistive pastes may be further expanded. Accordingly, further higher precision may be accomplished.

Figure 10:
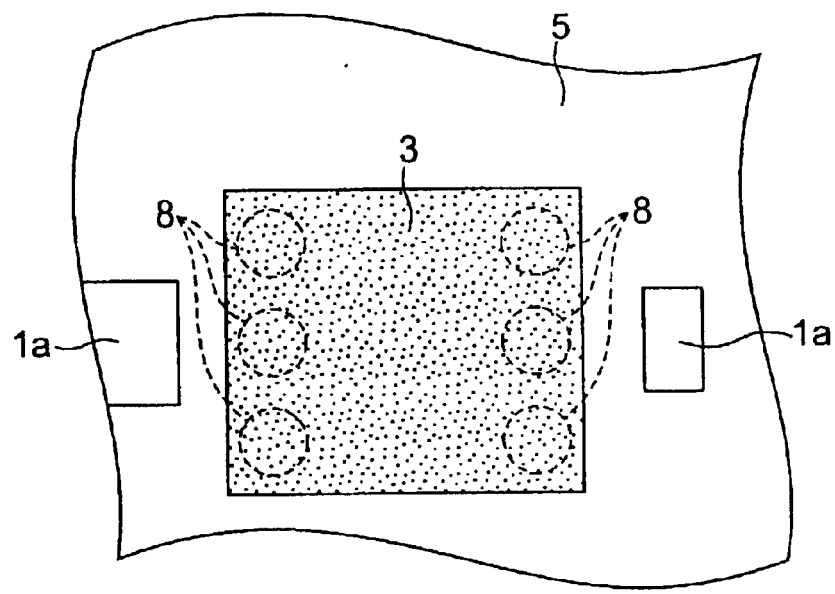
FIG. 10 is a bottom view of the double-sided wiring board shown in FIG. 9.

FIG. 10 is a bottom view as an example of the double-sided wiring board 7b shown in FIG. 9. The regions corresponding to FIG. 9 are given the same reference numerals.

As shown in FIG. 10, the contact between the resistive element 3 and the conductive bump 8 may occur at a plurality of points (three in this case shown in the figure) at one end. This is because while a shape of the resistive element 3 is varied in length and breadth according to a necessary resistance value, the size of the conductive bump 8 is normally fixed due to the simultaneous formation by use of, for instance, printing. By use of a plurality number of the conductive bumps 8, the lead wires may be drawn out corresponding to the size of the resistive element 3.

Figure 11:
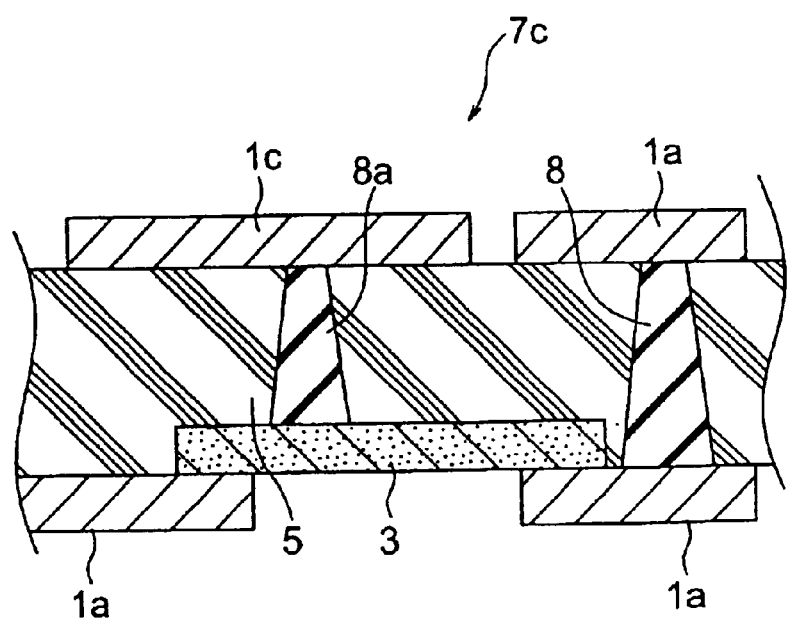
FIG. 11 is a partial sectional view showing another example to the example shown in FIG. 9.

FIG. 11 is a partial sectional view showing another example to one example shown in FIG. 9. The constituent elements that are already explained are given the same reference numerals.

The double-sided wiring board 7c is similar to one shown in FIG. 9 in that the conductive bumps 8a that penetrate through the insulating board 5 is directly formed on the resistive element 3. However, in the case shown in FIG. 11, the conductive bumps 8a are used, not as the lead wire, as heat conductor to the resistive element 3. The conductive bump 8a works as a heat conductive bridge with the wiring pattern 1c on a rear surface side of the resistive element 3. One resistive element 3 may be provided with a plurality of the conductive bumps 8a.

In a resistor that is configured so as to have the conductive bumps 8a for heat conduction, Joule heat that is generated due to the resistor may be efficiently dissipated from both surfaces of the wiring board by use of the conductive bumps 8a and the wiring pattern 1c as heat-sink. Accordingly, since the resistor is increased in its power rating, thereby a degree of freedom in circuit designing applied for the wiring board may be advantageously improved.

Figure 12A:
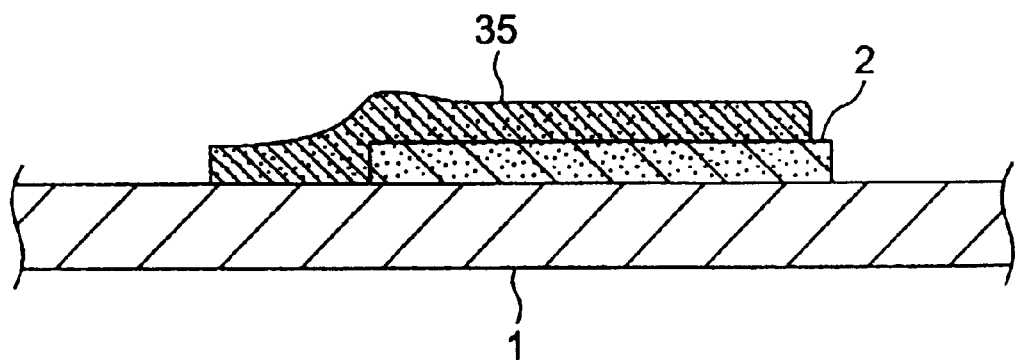
FIG. 12A and FIG. 12B are partial sectional views for explaining an example of a double-sided wiring board fabricated according to the fabricating method according to still another embodiment of the present invention.
Figure 12B:
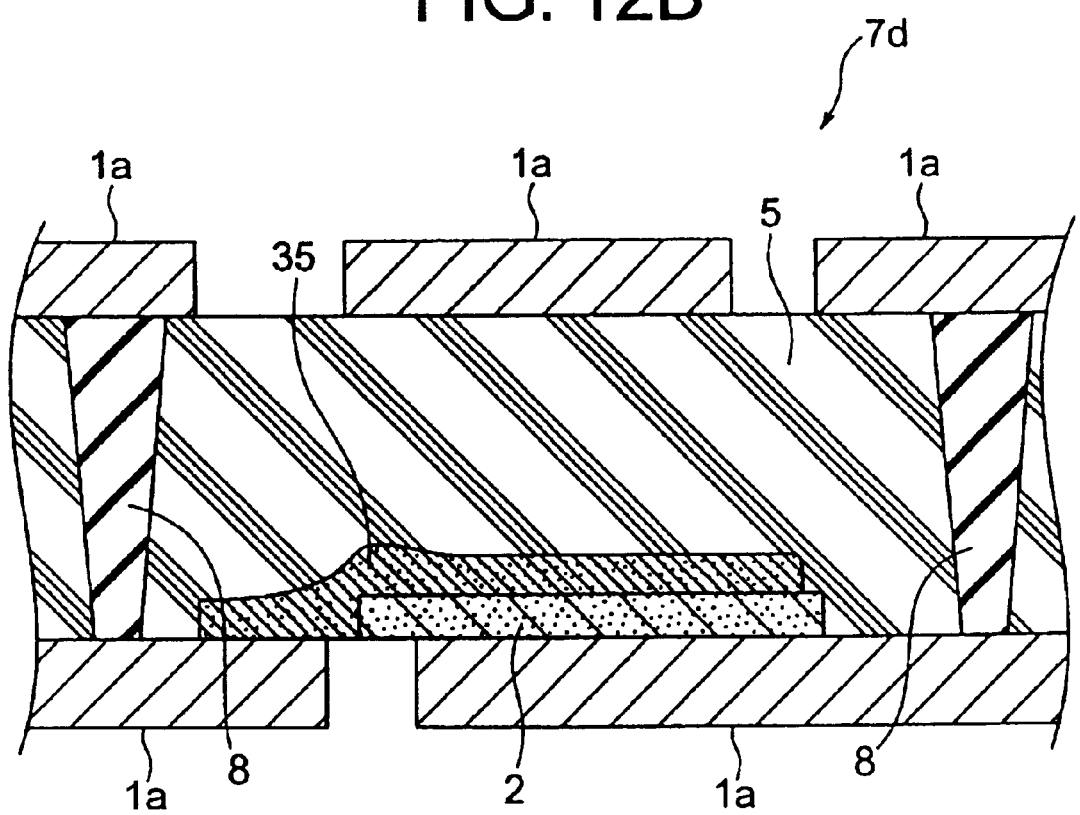

FIG. 12A and FIG. 12B are partial sectional views for explaining one example of a double-sided wiring board fabricated according to the fabricating method according to still another embodiment of the present invention. FIG. 12A shows an intermediate stage to a state shown in FIG. 12B. Furthermore, the constituent elements that are already explained are provided with the same reference numerals.

The double-sided wiring board 7d is different from one shown in FIG. 1A and FIG. 1B in that the pattern 1a and an electrical conductor 35 formed from the conductive paste are used as both end electrodes of the dielectrics 2.

In order to fabricate a double-sided wiring board in such a configuration, first, as shown in FIG. 12A, after dielectrics 2 is coated/formed on a metal foil 1, a conductive paste to be an electrical conductor 35 is coated including on the dielectrics 2 and extending onto the metal foil 1. In the coating, a method identical to that used in the coating of the dielectric paste to be the dielectrics 2 may be utilized. Treatment such as predetermined drying and so on is applied to the coated conductive paste. Then, the metal foil 1 is used in place of the coated/formed metal foil 4 shown in FIG. 1B upper side or FIG. 2B upper side and laminated. By further patterning the metal foils 1 on both sides, the double-sided wiring board 7d as shown in FIG. 12B may be obtained (in a strict sense, since there are the conductive bumps 8 in FIG. 12B, it shows a case applied to the case shown in FIG. 2B. However, the conductive bump 8 is not indispensable).

In a structure around the dielectrics 2 like this, since the pattern 1a and the electrical conductor 35 sandwich the dielectrics 2 and form a so-called parallel plate capacitor, a capacitor having higher capacitance may be formed. Furthermore, all of the already explained improvement effect as the passive element and wiring board is maintained.

Figure 13A:
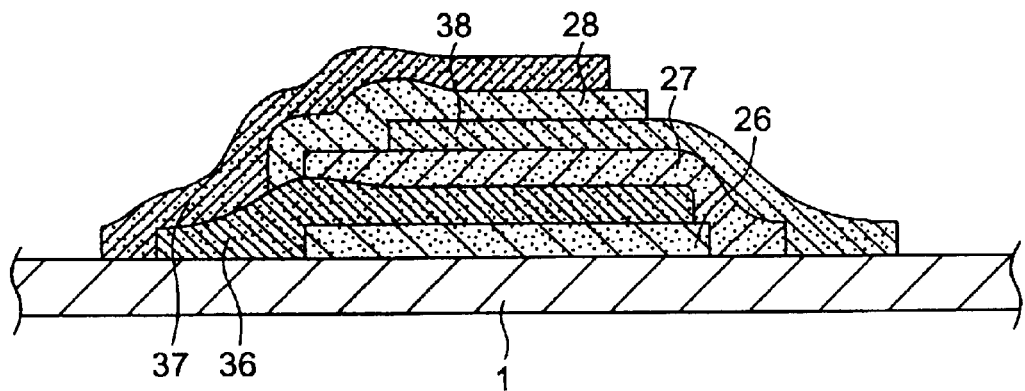
FIG. 13A and FIG. 13B are partial sectional views for explaining another example to the example shown in FIG. 12A and FIG. 12B.
Figure 13B:
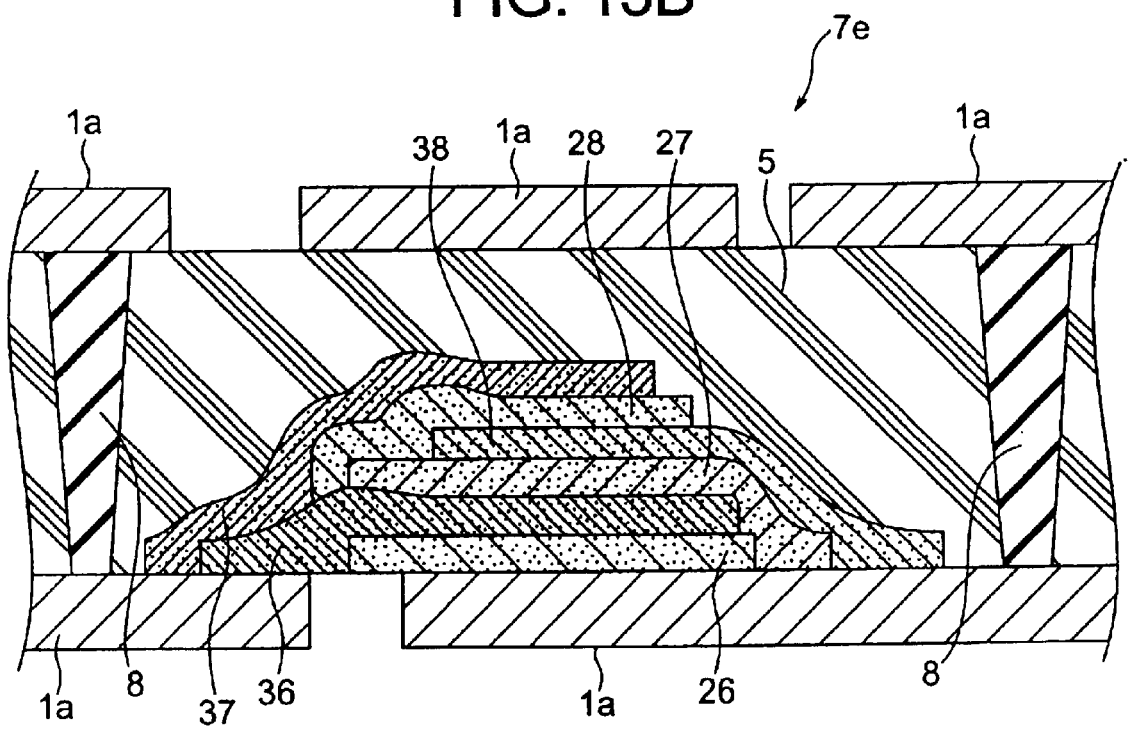

FIG. 13A and FIG. 13B are partial sectional views for explaining another example to one example shown in FIG. 12A and FIG. 12B. FIG. 13A shows an intermediate stage to a state shown in FIG. 13B. Furthermore, the constituent elements that are already explained are provided with the same reference numerals.

The double-sided wiring board 7e is one in which the aforementioned parallel plate capacitor structure is further actively formed. Due to the lamination like this, a capacitor having higher capacitance may be formed.

Specifically, as shown in FIG. 13A, first, dielectrics 26 is coated/formed on a metal foil 1 followed by coating a conductive paste to be an electrical conductor 36 so as to include on the dielectrics 26 and extend onto the metal foil 1. After the coating, processes such as predetermined drying and so on are performed. Next, a dielectric paste to be the dielectrics 27 is coated so as to include on the electrical conductor 36 and come into contact with the dielectrics 26. After the coating, processes such as predetermined drying and so on are performed. Next, the conductive paste to be an electrical conductor 38 is coated so as to include on the dielectrics 27, not to come into contact with the electrical conductor 36, and to extend onto the metal foil 1. After the coating, processes such as predetermined drying and so on are performed.

Furthermore, the dielectric paste to be dielectrics 28 is coated so as to include on the electrical conductor 38 and come into contact with the dielectric 27. After the coating, processes such as predetermined drying and so on are performed. Next, a conductive paste to be an electrical conductor 37 is coated so as to include on the dielectrics 28, not to come into contact with the electrical conductor 38, and to come into contact with the electrical conductor 36. After the coating, processes such as predetermined drying and so on are performed. The coating of the dielectric paste to be individual dielectrics 26, 27 and 28, and the coating of the conductive paste to be individual electrical conductors 36, 37 and 38 are performed similarly to the cases of the dielectrics 2 and the electrical conductor 35 in the embodiment shown in, for instance, FIG. 12A and FIG. 12B.

Then, the metal foil 1 is used in place of the coated/formed metal foil 4 shown in FIG. 1B upper side or FIG. 2B upper side and is laminated. Furthermore, by patterning the metal foils 1 on both sides, a double-sided wiring board 7e as shown in FIG. 13B may be obtained (since there are the conductive bumps 8 in FIG. 13B, in a strict sense, it shows a case applied to the case shown in FIG. 2B. However, the conductive bumps 8 are not indispensable). The patterning of the metal foil 1 is performed so that as one electrode a pattern that occupies almost on the dielectrics 26 and comes into contact also with the electrical conductor 38 may exist, and as another electrode a pattern having an electrical continuity with electrical conductors 36 and 37 may exist.

A capacitor due to such lamination may enable to realize a further higher capacitance by further performing similar lamination. Furthermore, all of the aforementioned improvement effect as the passive element and the wiring board is maintained.

Although the above-explained examples due to FIGS. 9 through 13B are of the cases of the double-sided wiring board, it is obvious that outer wiring layers in the four-layered wiring boards (or the above-explained three-layered wiring boards) as shown in FIG. 6 and FIG. 7 may allow to form the above-explained passive elements. Furthermore, the situations are identical also in the case of a multi-layered, exceeding four layers, wiring board.

Figure 15A:
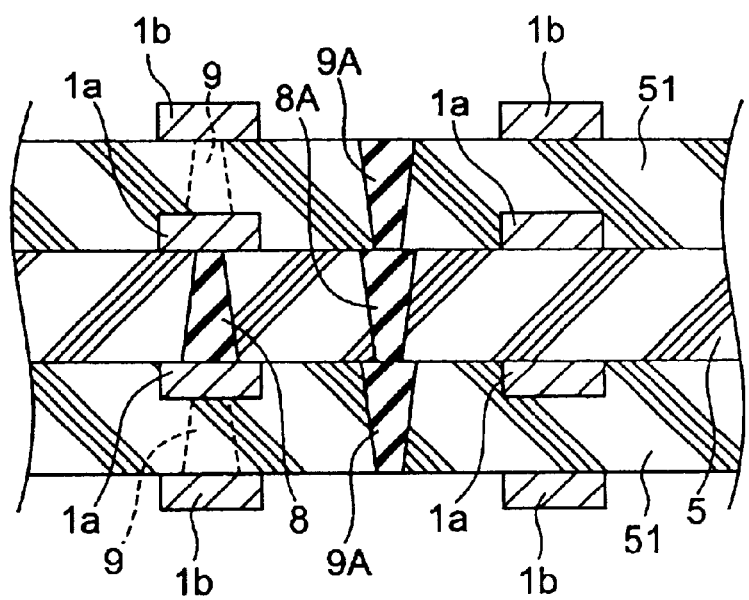
FIG. 15A and FIG. 15B are diagrams for explaining an example of a four-layered wiring board fabricated according to the fabricating method according to still another embodiment of the present invention.
Figure 15B:
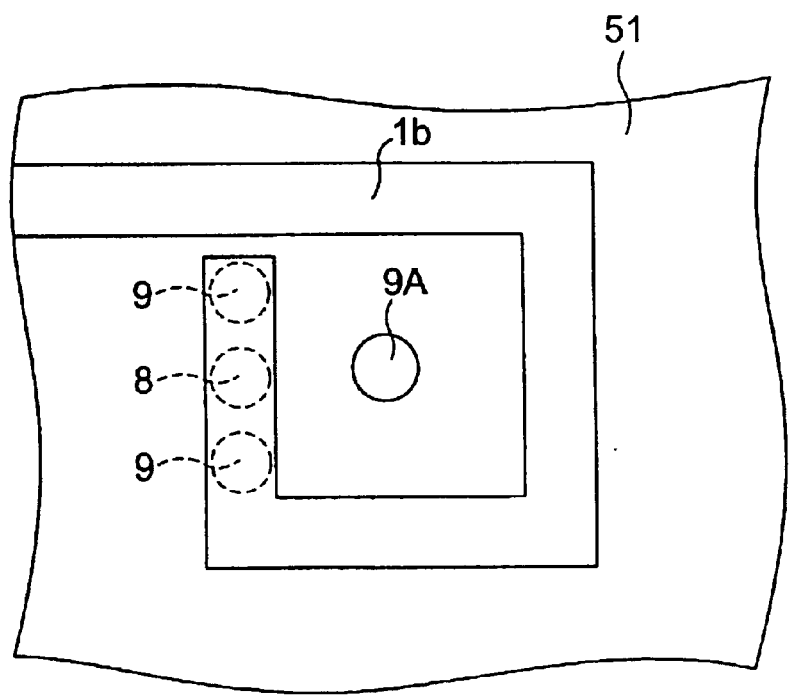

FIG. 15A and FIG. 15B are diagrams for explaining one example of a four-layered wiring board fabricated according to the fabricating method according to still another embodiment of the present invention. FIG. 15A is a sectional view and FIG. 15B is a top view thereof. The aforementioned constituent numerals are given the same reference numerals.

The four-layered wiring board is different from one shown in FIG. 6 and FIG. 7 in that there are formed magnetically permeable bumps 8A and 9A that, respectively, penetrate through insulating boards 5 and 51 and these magnetically permeable bumps 8A and 9A are in contact in a penetrating direction. Furthermore, patterns 1a and 1b are patterned, respectively, as shown in FIG. 15B, so as to surround the magnetically permeable bumps 8A and 9A and, as shown in FIG. 15A, the conductive bumps 8 and 9 bring ambient patterns into an electrical continuity in a vertical direction.

That is, the magnetically permeable bumps 8A and 9A work as a core of an inductor, and each patterns 1a and 1b work as a helical inductor coil as a whole. In thus structured inductor, since the magnetically permeable material is used as a core and a coil is realized as a helical coil around the core, an inductance value may be increased. It is obvious that the inductor due to such a core and helical structure is, without restricting to such the four-layered wiring board, may be configured similarly even in a double-sided wiring board, three-layered wiring board and multi-layered, exceeding four layers, wiring board.

In order to fabricate such the inductor that is incorporated in a four-layered wiring board, first, when a double-sided wiring board as a core wiring board is fabricated, in place of the coated/formed metal foil 4 in FIG. 2B upper side, a magnetically permeable bump formed metal foil fabricated according to the similar knack as the conductive bump formed metal foil 4a is used.

A magnetically permeable bump 8A may be formed on a place necessary as a wiring board on the coated/formed metal foil 4 by means of, for instance, screen printing. For this, as a magnetically permeable paste, for instance, one in which magnetically permeable material powder (for instance, ferrite powder) is dispersed in a paste-like resin followed by mingling a volatile solvent is prepared, and this is coated by means of screen-printing on the metal foil 4. The magnetically permeable bump 8A is necessary to have a height enough to penetrate through the insulating board 5. Accordingly, when one time screen-printing cannot give a necessary height, screen-printing is repeated a plurality of times to add height in a height direction while disposing a drying process between the screen-printings, and thereby forming into a substantially conical shape as a whole.

Then, following the above, processes up to one shown in FIG. 2B lower side are implemented. According to the processes up to this one, first, in the double-sided wiring board, an inductor due to a helical structure may be obtained.

Furthermore, in fabricating in a four-layered wiring board, in place of the metal foil 1 in FIG. 6 upper side, a metal foil provided with the magnetically permeable bump 9A thereon is used (a surface on which the magnetically permeable bump 9A is formed is directed downward). In addition, in place of the wiring board material 71 in FIG. 6 upper side, one in which the conductive bump 9 is formed on one side (top surface in the figure) of the double-sided wiring board including the aforementioned magnetically permeable bump 8A, and the magnetically permeable bump 9A is formed on the other surface is used. The magnetically permeable bump 9A can be formed similarly to the above.

Thereafter, the processes up to one shown in FIG. 6B lower side are performed. Thereby, an inductor due to a helical structure in which all layers of a four-layered wiring layer are used as coil can be obtained. Furthermore, by performing similarly, an inductor due to a helical structure in which all layers of an N-layered wiring layer are used as coil can be obtained.

Figure 16A:
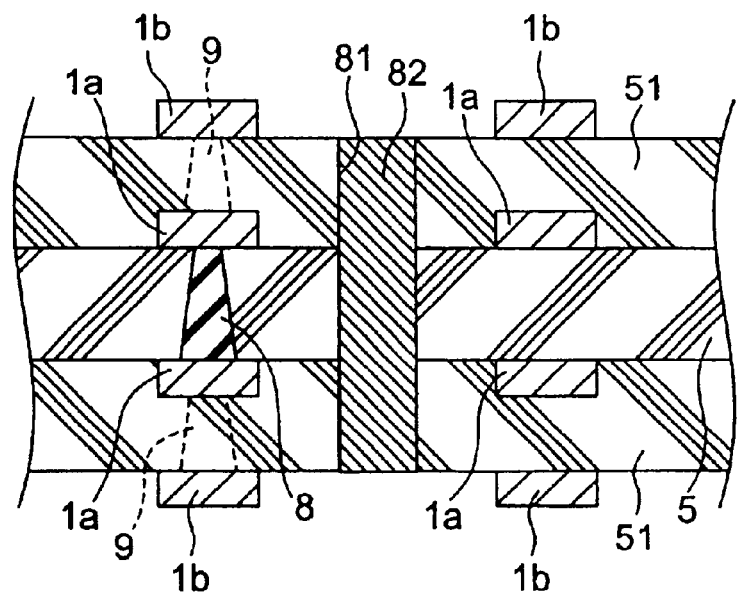
FIG. 16A and FIG. 16B are diagrams for explaining another example to the example shown in FIG. 15A and FIG. 15B.
Figure 16B:
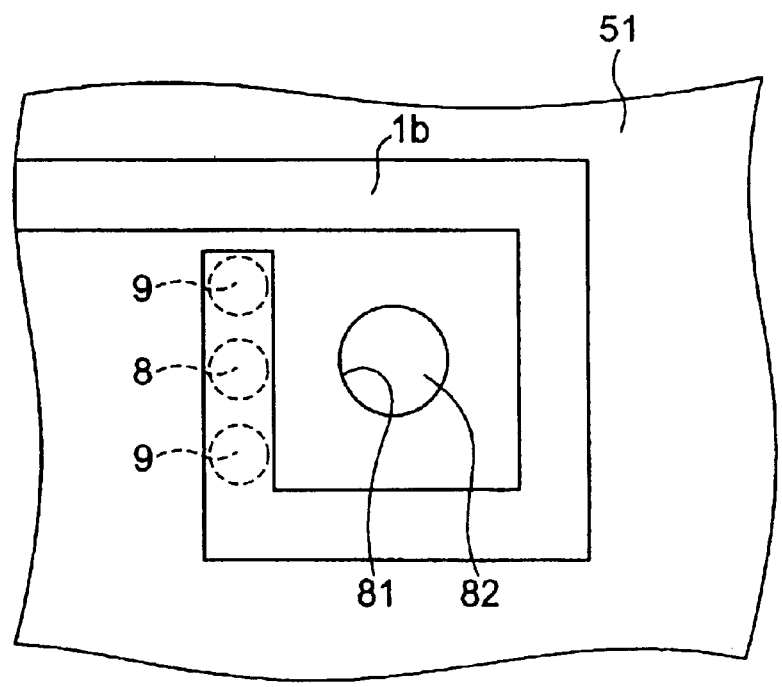

FIG. 16A and FIG. 16B are diagrams for explaining another example to one example shown in FIG. 15A and FIG. 15B. FIG. 16A is a sectional view thereof and FIG. 16B is a top view thereof. The aforementioned constituent elements are given the same reference numerals.

This four-layered wiring board is different from one shown in FIG. 15A and FIG. 15B in that a magnetically permeable pillared body 82 that penetrates through the insulating boards 5 and 51 is used in place of the magnetically permeable bumps 8A and 9A of the four-layered wiring board shown in FIG. 15A and FIG. 15B.

In this case too, the magnetically permeable pillared body 82 works as a core of an inductor, and each patterns 1a and 1b work as a helical inductor coil as a whole. Accordingly, similarly to the above, an inductance value may be increased. It is obvious that an inductor due to such a core of the magnetically permeable pillared body 82 and a helical structure, without restricting to such a four-layered wiring board, may be configured similarly even in a double-sided wiring board, three-layered wiring board, and multi-layered, exceeding four layers, wiring board.

In order to fabricate such an inductor incorporated in four-layered wiring board, a four-layered wiring board that has undergone the process shown in FIG. 6 lower side may be provided with a through-hole 81, and the formed through-hole 81 may be filled in with a magnetically permeable material. Similarly, a multi-layered, exceeding four layers, wiring board also, after a multi-layered wiring board having finally needed layers has been formed, may be provided with a through-hole, and the formed through-hole may be filled in with a magnetically permeable material. As a magnetically permeable material, the magnetically permeable material as mentioned above may be used, or previously solidified magnetically permeable pillared body may be inserted and fixed.

The present invention has been described with reference to certain preferred embodiments, but it will be understood that variations and modifications can be made within the spirit and scope of the invention.

What is claimed is:

1. A wiring board comprising:
   an insulating board having a first surface and a second surface;
   a stratified resistive element and/or stratified dielectrics embedded in the insulating board so as to appear in the first surface and/or the second surface of the insulating board;
   a first wiring layer and a second wiring layer that are, respectively, disposed on the first surface and the second surface of the insulating board, and each of which has a connection with the stratified resistive element and/or the stratified dielectrics in the corresponding first/second surface; and
   a conductive bump that penetrates through the insulating board and has an electrical connection with each of the first and second wiring layers, the conductive bump having a shape of a substantially truncated cone whose axis faces the first and second wiring layers.

2. A wiring board as set forth in claim 1:
   wherein at least one of the first and second wiring layers has an inductor that is vortically formed due to a pattern and/or a loop antenna that is formed loop-like due to a pattern.

3. A wiring board as set forth in claim 1, further comprising:
   a second insulating board disposed in contact with the first wiring layer side of the insulating board;
   a second conductive bump that penetrates through a second insulating board; and
   a third wiring layer disposed on a side different from the insulating board side of the second insulating board;
   wherein the first wiring layer of the insulating board is disposed so as to sink in a thickness direction of the second insulating board; and
   each of the first and third wiring layers having an electrical connection with the second conductive bump.

4. A wiring board as set forth in claim 3, further comprising:
   a second stratified resistive element and/or second stratified dielectrics embedded in the second insulating board so as to appear in the third wiring layer side of the second insulating board;
   wherein the third wiring layer has a connection with the second stratified resistive element/the second stratified dielectrics.

5. A wiring board as set forth in claim 3:
   wherein the third wiring layer has an inductor that is vortically formed due to a pattern and/or a loop antenna that is formed loop-like due to a pattern.

6. A wiring board as set forth in claim 3, further comprising:
   a third insulating board disposed in contact with the second wiring layer side of the insulating board;
   a third conductive bump that penetrates through the third insulating board; and a fourth wiring layer disposed on a side different from the insulating board side of the third insulating board;

wherein the second wiring layer of the insulating board is disposed so as to sink in a thickness direction of the third insulating board; and each of the second and fourth wiring layers has an electrical connection with the third conductive bump.

7. A wiring board as set forth in claim 6, further comprising:

a second stratified resistive element and/or a second stratified dielectrics embedded in the third insulating board so as to appear in the fourth wiring layer side of the third insulating board;

wherein the fourth wiring layer has a connection with the second stratified resistive element/the second stratified dielectrics.

8. A wiring board as set forth in claim 6:

wherein the fourth wiring layer has an inductor that is vortically formed due to a pattern and/or a loop antenna that is formed loop-like due to a pattern.

9. A wiring board, comprising:

an insulating board having a first surface and a second surface;

a stratified resistive element and/or stratified dielectrics embedded in the insulating board so as to appear in the first surface and/or the second surface of the insulating board;

a first wiring layer and a second wiring layer that are, respectively, disposed on the first surface and the second surface of the insulating board, and each of which has a connection with the stratified resistive element and/or the stratified dielectrics in the corresponding first/second surface; and a conductive bump that penetrates through the insulating board and has an electrical connection with each of the first and second wiring layers, the conductive bump being a shape having an axis facing the first and second wiring layers and having a diameter varying along the axis.

10. A wiring board as set forth in claim 9:

wherein at least one of the first and second wiring layers has an inductor that is vortically formed due to a pattern and/or a loop antenna that is formed loop-like due to a pattern.

11. A wiring board as set forth in claim 9, further comprising:

a second insulating board disposed in contact with the first wiring layer side of the insulating board;

a second conductive bump that penetrates through the second insulating board; and a third wiring layer disposed on a side different from the insulating board side of the second insulating board;

wherein the first wiring layer of the insulating board is disposed so as to sink in a thickness direction of the second insulating board; and each of the first and third wiring layers having an electrical connection with the second conductive bump.

12. A wiring board as set forth in claim 11, further comprising:

a second stratified resistive element and/or second stratified dielectrics embedded in the second insulating board so as to appear in the third wiring layer side of the second insulating board;

wherein the third wiring layer has a connection with the second stratified resistive element/the second stratified dielectrics.

13. A wiring board as set forth in claim 11:

wherein the third wiring layer has an inductor that is vortically formed due to a pattern and/or a loop antenna that is formed loop-like due to a pattern.

14. A wiring board as set forth in claim 11, further comprising:

a third insulating board disposed in contact with the second wiring layer side of the insulating board;

a third conductive bump that penetrates through the third insulating board; and a fourth wiring layer disposed on the third insulating board on a side different from the insulating board side of the third insulating board;

wherein the second wiring layer of the insulating board is disposed so as to sink in a thickness direction of the third insulating board; and each of the second and fourth wiring layers having an electrical connection with the third conductive bump.

15. A wiring board as set forth in claim 14, further comprising:

a second stratified resistive element and/or second stratified dielectrics embedded in the third insulating board so as to appear in the fourth wiring layer side of the third insulating board;

wherein the fourth wiring layer has a connection with the second stratified resistive element/the second stratified dielectrics.

16. A wiring board as set forth in claim 14:

wherein the fourth wiring layer has an inductor that is vortically formed due to a pattern and/or a loop antenna that is formed loop-like due to a pattern.

* * * * *

UNITED STATES PATENT AND TRADEMARK OFFICE
CERTIFICATE OF CORRECTION

PATENT NO.     : 6,872,893 B2
DATED          : March 29, 2005
INVENTOR(S)    : Fukuoka et al.

It is certified that error appears in the above-identified patent and that said Letters Patent is hereby corrected as shown below:

Column 24,
Line 23, change "first/second" to -- first and/or second --.

Column 25,
Line 35, change "first/second" to -- first and/or second --.

Signed and Sealed this

Twenty-third Day of August, 2005

JON W. DUDAS
*Director of the United States Patent and Trademark Office*